(12) United States Patent
Huang et al.

(10) Patent No.: US 11,133,278 B2
(45) Date of Patent: Sep. 28, 2021

(54) SEMICONDUCTOR PACKAGE INCLUDING CAP LAYER AND DAM STRUCTURE AND METHOD OF MANUFACTURING THE SAME

(71) Applicant: Advanced Semiconductor Engineering, Inc., Kaohsiung (TW)

(72) Inventors: Yu-Che Huang, Kaohsiung (TW); Ching-Han Huang, Kaohsiung (TW); An-Nong Wen, Kaohsiung (TW); Po-Ming Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 85 days.

(21) Appl. No.: 16/583,006

(22) Filed: Sep. 25, 2019

(65) Prior Publication Data

US 2020/0111760 A1   Apr. 9, 2020

Related U.S. Application Data

(60) Provisional application No. 62/742,241, filed on Oct. 5, 2018.

(51) Int. Cl.
*H01L 23/00* (2006.01)
*H01L 21/768* (2006.01)

(52) U.S. Cl.
CPC ........ *H01L 24/16* (2013.01); *H01L 21/76832* (2013.01); *H01L 24/08* (2013.01); *H01L 24/32* (2013.01)

(58) Field of Classification Search
CPC ......... H01L 24/16; H01L 24/08; H01L 24/32; H01L 21/76832
See application file for complete search history.

(56) References Cited

U.S. PATENT DOCUMENTS

| | | | |
|---|---|---|---|
| 2005/0067681 A1* | 3/2005 | De Villeneuve | ........ H01L 23/04 257/678 |
| 2008/0112037 A1* | 5/2008 | Pan | ........ H01L 23/041 359/291 |
| 2014/0070411 A1* | 3/2014 | Okada | ........ H01L 23/49811 257/737 |
| 2016/0240500 A1* | 8/2016 | Huang | ........ H01L 24/11 |

* cited by examiner

*Primary Examiner* — Quoc D Hoang
(74) *Attorney, Agent, or Firm* — Foley & Lardner LLP

(57) ABSTRACT

A semiconductor package and a method of manufacturing the same are provided. The semiconductor package includes a semiconductor die, a cap layer, a conductive terminal, and a dam structure. The semiconductor die has a first surface. The cap layer is over the semiconductor die and has a second surface facing the first surface of the semiconductor die. The conductive terminal penetrates the cap layer and electrically connects to the semiconductor die. The dam structure is between the semiconductor die and the cap layer and surrounds a portion of the conductive terminal between the first surface and the second surface, thereby forming a gap between the cap layer and the semiconductor die.

21 Claims, 34 Drawing Sheets

SEMICONDUCTOR PACKAGE INCLUDING CAP LAYER AND DAM STRUCTURE AND METHOD OF MANUFACTURING THE SAME

CROSS-REFERENCE TO RELATED APPLICATIONS

This application claims the benefit of and priority to U.S. Provisional Application No. 62/742,241, filed Oct. 5, 2018, the contents of which are incorporated herein by reference in their entirety.

BACKGROUND

1. Technical Field

The present disclosure relates to a semiconductor package and a method of manufacturing the same and, more particularly, to a wafer-level chip-scale package, chip-to-wafer package, or wafer-to-wafer package.

2. Description of the Related Art

There is a continuing desire to reduce dimensions of a semiconductor package (e.g., a land grid array (LGA) package). There is also a continuing desire in a flip-chip package (e.g., a bumped type package) to prevent contaminants resulted from forming conductive terminals from entering the active region of a semiconductor die. It would be therefore desirable to provide semiconductor packages that can ease the contamination problem and at the same time satisfy the miniaturization demand.

SUMMARY

In an aspect, a semiconductor package includes a semiconductor die, a cap layer, a conductive terminal, and a dam structure. The semiconductor die has a first surface. The cap layer is over the semiconductor die and has a second surface facing the first surface of the semiconductor die. The conductive terminal penetrates the cap layer and electrically connects to the semiconductor die. The dam structure is between the semiconductor die and the cap layer and surrounds a portion of the conductive terminal between the first surface and the second surface, thereby forming a gap between the cap layer and the semiconductor die.

In an aspect, a method of manufacturing a semiconductor package includes: patterning a cap wafer to form a through opening connecting a first surface and a second surface of the cap wafer; patterning a bonding layer at the second surface of the cap wafer; bonding the cap wafer to a semiconductor wafer; and dicing the cap wafer and the semiconductor wafer.

BRIEF DESCRIPTION OF THE DRAWINGS

FIG. 8A, FIG. 8B, FIG. 8C, FIG. 8D, FIG. 8E, FIG. 8F, FIG. 8G, FIG. 8H, FIG. 8I, FIG. 8J, FIG. 8K, FIG. 8N, FIG. 8O, FIG. 8P, and FIG. 8Q illustrate a method for manufacturing a semiconductor package such as the semiconductor package of FIG. 3.

FIG. 11A, FIG. 12A, FIG. 13A, FIG. 14A, FIG. 15A, and FIG. 16A illustrate a method for manufacturing a semiconductor package according to an embodiment of the present disclosure.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor package including a semiconductor die and a protection structure in a form of a cap layer protecting the active region of the semiconductor die. The semiconductor package disclosed herein can be free of wire bonding structure, lid structure, or die seal such as epoxy, thereby being more advantageous in package size reduction and contamination prevention. The semiconductor package disclosed herein can be fabricated by wafer-level chip-scale package, chip-to-wafer package, or wafer-to-wafer package.

Different from wafer-level packages, a semiconductor package such as a land grid array (LGA) package or a flip-chip package (e.g., a bumped type package) undergo packaging operations in a one-by-one manner, that is, each of the semiconductor die is first singulated, picked and placed over the substrate 110, and followed by wire bonding operation or solder reflow operation. In some embodiments of the present disclosure, the semiconductor packages are fabricated under a wafer level chip scale packaging technique (WLCSP), that is, processed wafers are bonded together prior to dicing into individual chips.

Figure 1:
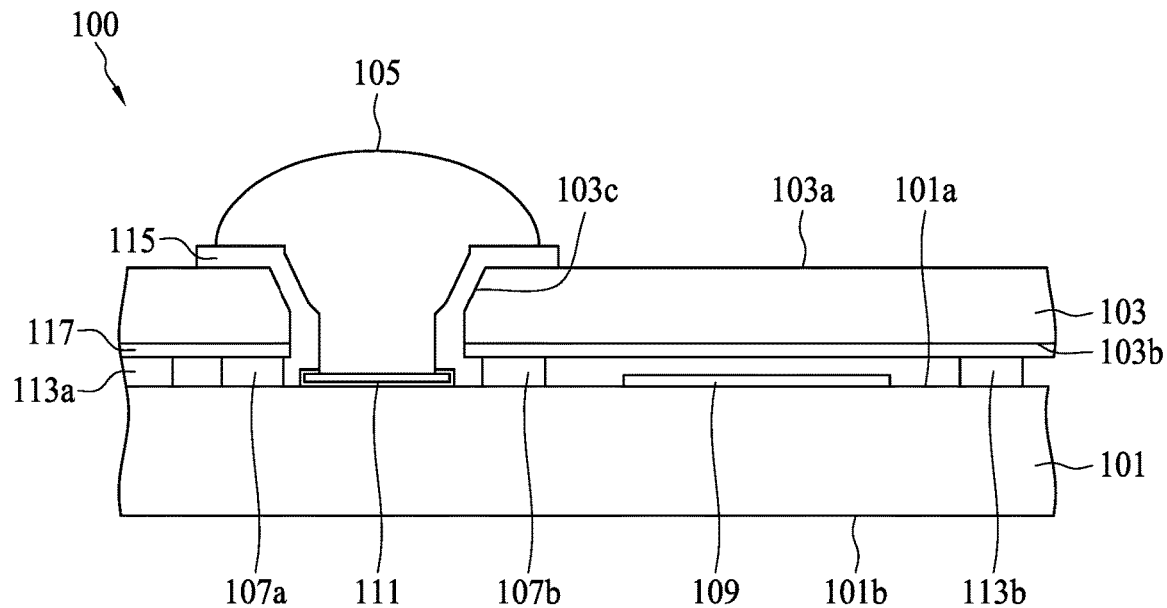
FIG. 1 illustrates a cross-sectional view of a semiconductor package according to an embodiment of the present disclosure.

FIG. 1 illustrates a cross-sectional view of a semiconductor package 100 according to an embodiment of the present disclosure. The semiconductor package 100 of FIG. 1 includes a semiconductor die 101, a cap layer 103, a conductive terminal 105, and a dam structure 107a, 107b.

The semiconductor die 101 may be a chip (e.g., a communication chip, a microprocessor chip, a graphics chip, or a microelectromechanical systems (MEMS) chip diced from a wafer), a package, an interposer, or a combination thereof. In some embodiments, a MEMS chip may include, for example, a micro-sized electromechanical component (e.g., an optical device, a switch, a mirror, a filter, a transducer, an accelerometer, a microphone, a capacitive sensor, a sensor or an actuator etc.).

The semiconductor die 101 has a first die surface 101a and a second die surface 101b opposite to the first die surface 101a. The semiconductor die 101 may include an active region 109 disposed adjacent to the first die surface 101a of the semiconductor die 101. In some embodiments, the active region 109 is disposed in proximal to a center of the semiconductor die 101. The semiconductor die 101 may include at least one bonding pad 111 disposed adjacent to the first die surface 101a of the semiconductor die 101. In some embodiments, the bonding pad 109 is disposed around the active region 109. In some embodiments, the bonding pad 109 is disposed directly (e.g., in physical contact) on the first die surface 101a of the semiconductor die 101. The bonding pad 109 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The cap layer 103 is disposed over the semiconductor die 101. The cap layer 103 has a first cap surface 103a and a second cap surface 103b opposite to the first cap surface 103a. The cap layer 103 may define at least one first through opening 103c corresponding to the respective bonding pad 109. The cap layer 103 may include, for example, one of, or a combination of, silicon, high-resistive silicon, or glass. In some embodiments where the semiconductor die 101 is an optical device, the cap layer 103 includes a glass material.

The conductive terminal 105 penetrates the cap layer 103. The conductive terminal 105 may be disposed in the first through opening 103c of the cap layer 103. The conductive terminal 105 may be disposed on the bonding pad 111 and electrically connects to the semiconductor die 101. Alternatively, the conductive terminal 105 may be isolated connected to the semiconductor die 101. The conductive terminal 105 may be, for example, a solder ball.

In some embodiments, the bonding pad 111 is disposed on the first die surface 101a of the semiconductor die 101 and the conductive terminal 105 is disposed in the first through opening 103c of the cap layer 103 and on the bonding pad 111 and the semiconductor die 101 electrically connects to the conductive terminal 105. By disposing the conductive terminal 105 penetrating the cap layer 103, a shorter path for transmitting an electrical signal to the semiconductor die 101 can be provided, which may increase the signal transmission speed.

The dam structure 107a, 107b is disposed between the semiconductor die 101 and the cap layer 103. The dam structure 107a, 107b may be disposed adjacent to the first die surface 101a of the semiconductor die 101. The dam structure 107a, 107b may be disposed adjacent to the bonding pad 111. The dam structure 107a, 107b may be disposed around the first through opening 103c of the cap layer 103. The dam structure 107a, 107b may surround the bonding pad 111. The dam structure 107a, 107b may surround the bonding pad 111 and spaced from the bonding pad 111. The dam structure 107a, 107b may surround a portion of the conductive terminal 105 between the first die surface 101a of the semiconductor die 101 and the second cap surface 103b of the cap layer 103. In some embodiments, the dam structure 107a, 107b is disposed around the first through opening 103c of the cap layer 103. In some embodiments, the dam structure 107a, 107b is between the semiconductor die 101 and the cap layer 103 and surrounds the bonding pad 111 thereby forming a gap between the cap layer 103 and the semiconductor die 101 so when disposing the conductive terminal 105 on the bonding pad 111, the space between the dam structure 107a, 107b, the cap layer 103, and the semiconductor die 101 may accommodate the conductive terminal 105 and prevent solder flux from overflowing to the vicinity and contaminate the active region 109.

In some embodiments, the conductive terminal 105 is disposed in the first through opening 103c of the cap layer 103 and electrically connected to the semiconductor die 101 and the dam structure 107a, 107b surrounds a portion of the conductive terminal 105. By disposing the dam structure 107a, 107b around where the conductive terminal 105 is disposed on, the contamination that may be caused by disposing the conductive terminal 105 may be reduced by confining it in a limited space. The dam structure 107a, 107b may include, for example, a photoresist material (e.g., SU-8), a polymeric material (e.g., benzocyclobutene (BCB)), an epoxy, or a metallic material (e.g., an eutectic alloy including, but not limited to, Au—In, Cu—Sn, Au—Sn, Au—Ge, Au—Si, Al—Ge, Al—Si). Eutectic alloys possess greater bonding strength than the polymeric counterpart while occupying less area between the cap layer 103 and the semiconductor die 101.

In some embodiments, such as the one illustrated in FIG. 1, the semiconductor package 100 may further include a bonding structure 113a, 113b disposed between the semiconductor die 101 and the cap layer 103. The bonding structure 113a, 113b is disposed surrounding the semiconductor die 101. In some embodiments, the bonding structure 113a, 113b is disposed at the periphery of the semiconductor die 101. In some embodiments, the bonding structure 113a, 113b is disposed adjacent to the cutting edge for individualizing the semiconductor die 101. The cap layer 103 may be bonded to the semiconductor die 101 through the bonding structure 113a, 113b.

In some embodiments where the bonding structure 113a, 113b is disposed adjacent to the cutting edge of the semiconductor die 101, the bonding structure 113a, 113b may prevent the semiconductor die 101 from contamination from the debris produced during the cutting process (e.g., a singulation process). The bonding structure 113a, 113b may include, for example, a photoresist material, a polymer material (e.g., benzocyclobutene (BCB)), epoxy, metal, or a combination thereof. The material and dimension (e.g., height and/or width) of the bonding structure 113a, 113b and the material and dimension (e.g., height and/or width) of the dam structure 107a, 107b may be the same or different.

In some embodiments, such as the one illustrated in FIG. 1, the semiconductor package 100 may further include an isolation layer 115 disposed between the conductive terminal 105 and the cap layer 103. In some embodiments, the isolation layer 115 is in line with a sidewall of the first through opening 103c of the cap layer 103. In some embodiments, the isolation layer 115 is in line with a sidewall of the first through opening 103c of the cap layer 103 and defines an area for disposing the conductive terminal 105 by covering a portion of the bonding pad 111. The isolation layer 115 may include, for example, a polymeric material (e.g., polybenzoxazole (PBO). The isolation layer 115 may provide better wetting property of the conductive terminal 105 and therefore better adhesion property between the conductive terminal 105 and the cap layer 103. Alternatively, the isolation layer 115 can be omitted when the cap layer 103 is composed of high resistive silicon or glass.

In some embodiments, such as the one illustrated in FIG. 1, the semiconductor package 100 may further include a first passivation layer 117 disposed between the cap layer 103 and the dam structure 107a, 107b. In some embodiments, the first passivation layer 117 is disposed adjacent to the second cap surface 103b of the cap layer 103. In some embodiments, the first passivation layer 117 is disposed on the second cap surface 103b of the cap layer 103 and is directly in contact with the dam structure 107a, 107b.

Figure 2A:
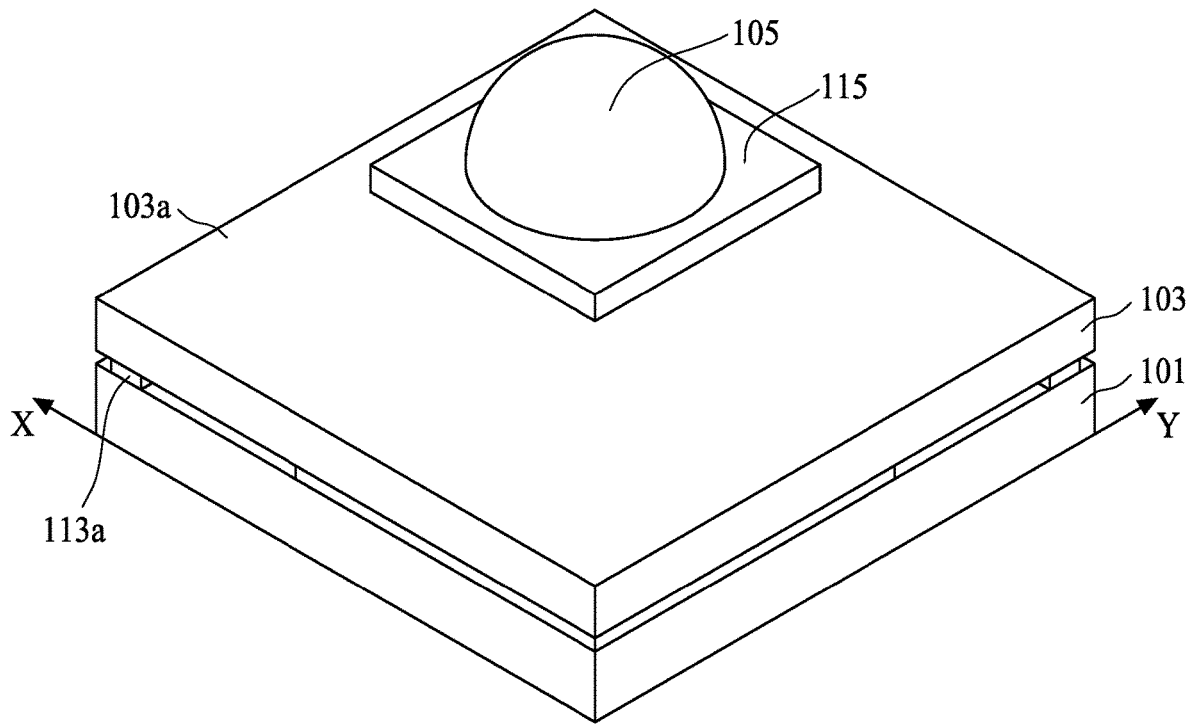
FIG. 2A illustrates a perspective view of a quarter of a complete semiconductor package such as the one illustrated in FIG. 1.

FIG. 2A illustrates a perspective view of a quarter of a complete semiconductor package such as the one illustrated in FIG. 1, dissecting along two symmetrical axes, for example, X and Y, for the purpose of description. In FIG. 2A, the cap layer 103 is stacked on the semiconductor die 101 with the bonding structure 113a therebetween. The conductive terminal 105 protrudes from the first cap surface 103a of the cap layer 103 and electrically connects to the bonding pad 111 of the semiconductor die 101 by penetrating through the first through opening 103c of the cap layer 103. The isolation layer 115 is lining through the first through opening 103c of the cap layer 303 between the conductive terminal 105 and the cap layer 103 and extends over the first cap surface 103a of the cap layer 103. The conductive terminal 105 is disposed on the isolation layer 115.

Figure 2B:
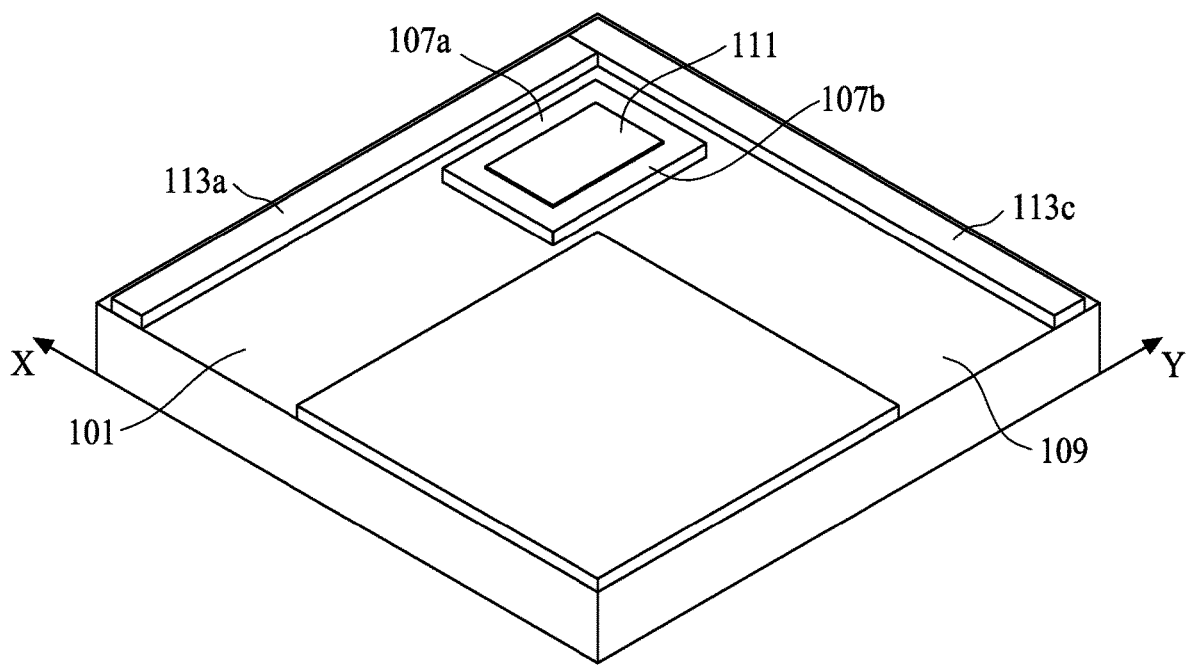
FIG. 2B illustrates a perspective view of a quarter of a complete semiconductor package such as the one illustrated in FIG. 1.

FIG. 2B illustrates a perspective view of a quarter of a complete semiconductor package such as the one illustrated in FIG. 1 with the cap layer being removed, dissecting along two symmetrical axes, for example, X and Y, for the purpose of description. In FIG. 2B, the active region 109 of the semiconductor die 101 is disposed in proximal to a center of the complete semiconductor package. The bonding pad 111 which is configured to receive the conductive terminal 105 from the cap layer 103 is positioned in proximal to a corner of the complete semiconductor package. The dam structure 107a, 107b surrounds the bonding pad 111 from all four sides. The bonding structure 113a, 113c lines at the sides of the complete semiconductor package. In some embodiments, similar to the bonding structure 113a, 113c, the dam structure 107a, 107b serves the purpose of bonding the semiconductor die 101 with the cap layer 103 and can be patterned over the semiconductor die 101 at the same operation of patterning the bonding structure 113a, 113b. It should be understood by people having ordinary skill in the art that the layout of the active region 109, the bonding structure 113a, 113c, the dam structure 107a, 107b, and the bonding pad 111 can be altered according to different package layouts and so do the conductive terminal 105 and the isolation layer 115.

Figure 3:
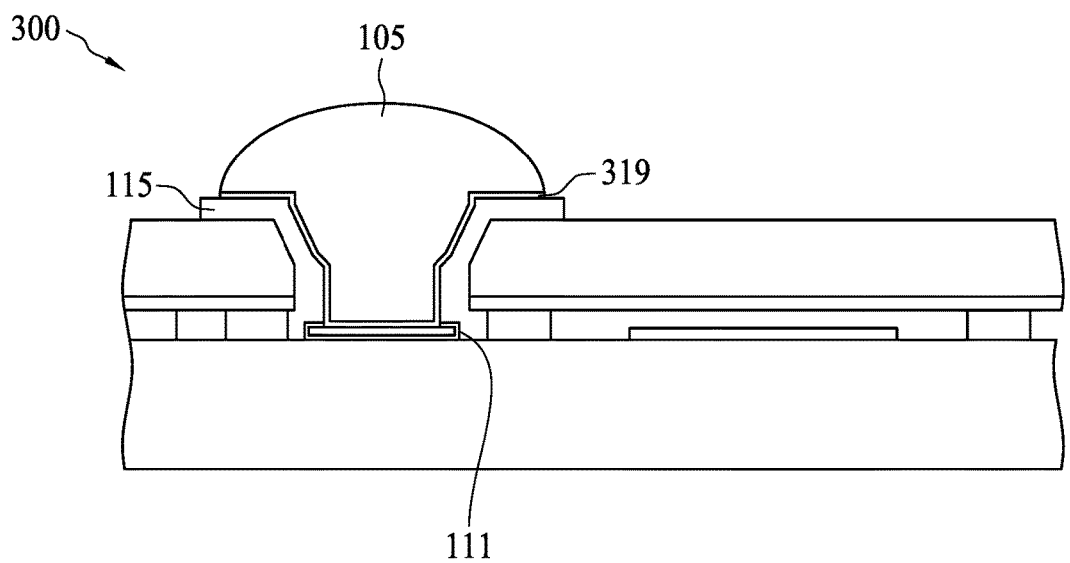
FIG. 3 illustrates a cross-sectional view of a semiconductor package according to an embodiment of the present disclosure.

FIG. 3 illustrates a cross-sectional view of a semiconductor package 300 according to an embodiment of the present disclosure. The semiconductor package 300 is similar to that illustrated in FIG. 1, with a difference including that a metal layer 319 is disposed between the conductive terminal 105 and the isolation layer 115. In some embodiments, the metal layer 319 is disposed on the isolation layer 115 and the bonding pad 111. In some embodiments, the metal layer 310 is lining with the isolation layer 115 and covers a surface of the bonding pad 111. By providing the metal layer 319 together with the isolation layer 115, a better wetting property of the conductive terminal 105 and therefore a better adhesion property between the conductive terminal 105 and the isolation layer 115 can be provided.

Figure 4:
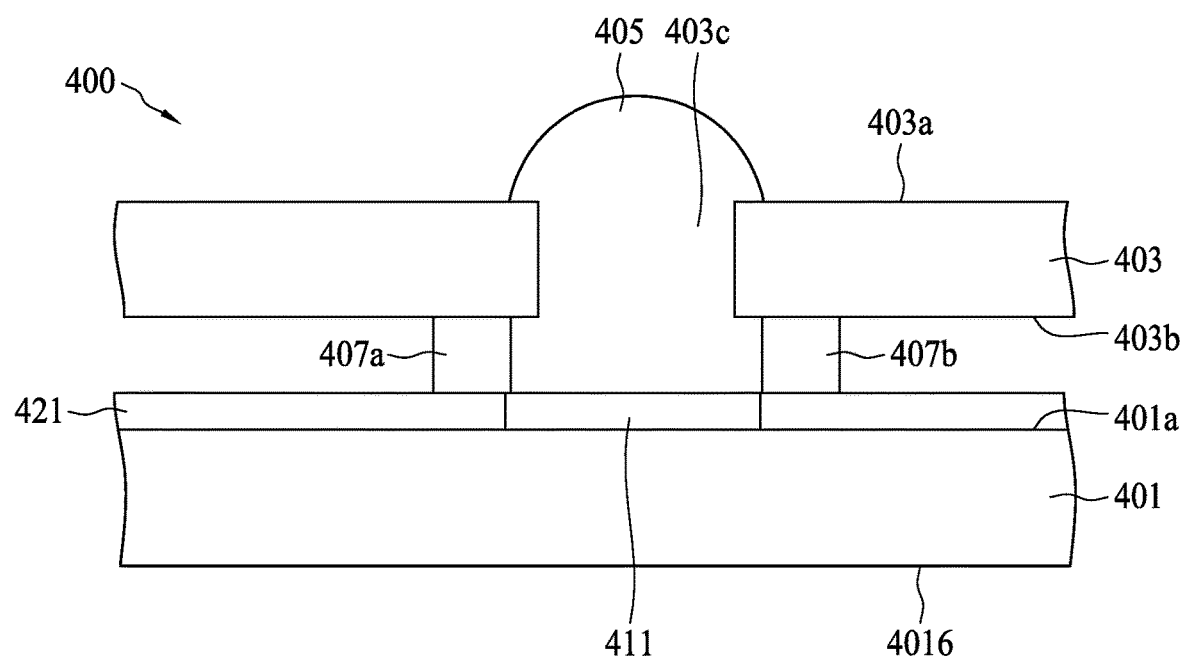
FIG. 4 illustrates a cross-sectional view of a semiconductor package according to an embodiment of the present disclosure.

FIG. 4 illustrates a cross-sectional view of a semiconductor package 400 according to an embodiment of the present disclosure. The semiconductor package 400 of FIG. 4 includes a semiconductor die 401, a cap layer 403, a conductive terminal 405, and a dam structure 407a, 407b.

The semiconductor die 401 may be a chip (e.g., a communication chip, a microprocessor chip, a graphics chip, or a microelectromechanical systems (MEMS) chip diced from a wafer), a package, an interposer, or a combination thereof. In some embodiments, a MEMS chip may include, for example, a micro-sized electromechanical component (e.g., an optical device, a switch, a mirror, a filter, a transducer, an accelerometer, a microphone, a capacitive sensor, a sensor or an actuator etc.). The semiconductor die 401 has a first die surface 401a and a second die surface 401b opposite to the first die surface 401a. The semiconductor die 401 may include at least one bonding pad 411 disposed adjacent to the first die surface 401a of the semiconductor die 401. In some embodiments, the bonding pad 411 is disposed directly (e.g., in physical contact) on the first die surface 401a of the semiconductor die 401. The bonding pad 411 may include, for example, one of, or a combination of, copper, gold, indium, tin, silver, palladium, osmium, iridium, ruthenium, titanium, magnesium, aluminum, cobalt, nickel, or zinc, or other metals or metal alloys. A second passivation layer 421 may be disposed adjacent to the first die surface 401a of the semiconductor die 401. The second passivation layer 421 is disposed exposing the bonding pad 411. In some embodiments, the passivation layer 421 is directly in contact with the first die surface 401a of the semiconductor die 401.

The cap layer 403 is disposed over the semiconductor die 401. The cap layer 403 has a first cap surface 403a and a second cap surface 403b opposite to the first cap surface 403a. The cap layer 403 may define at least one first through opening 403c corresponding to the respective bonding pad 411. The cap layer 403 may include, for example, one of, or a combination of, silicon, high-resistive silicon, or glass. In some embodiments where the semiconductor die 401 is an optical device, the cap layer 403 includes a glass material.

The conductive terminal 405 penetrates the cap layer 403. The conductive terminal 405 may be disposed in the first through opening 403c of the cap layer 103. The conductive terminal 405 may be disposed on the bonding pad 411. The conductive terminal 405 may be, for example, a solder ball or a pillar structure, which may include an under bump metallization (UBM) layer, a pillar, a barrier layer, a solder layer, or a combination of two or more thereof. The UBM layer may include, for example, a solder material. The pillar may include, for example, a copper. The barrier layer may include, for example, a nickel. In some embodiments, the conductive terminal 405 is a solder ball.

In some embodiments, the bonding pad 411 is disposed on the first surface 401a of the semiconductor die 401 and surrounded by the second passivation layer 421 and the conductive terminal 405 is disposed in the first through opening 403c of the cap layer 403 and on the bonding pad 411 and the semiconductor die 401 electrically connects to the conductive terminal 405. By disposing the conductive terminal 405 penetrating the cap layer 403, a shorter path for transmitting an electrical signal to the semiconductor die 401 can be provided, which may increase the signal transmission speed.

The dam structure 407a, 407b is disposed between the semiconductor die 401 and the cap layer 403. The dam structure 407a. 407b may be disposed adjacent to the first die surface 401a of the semiconductor die 401. The dam structure 407a, 407b may be disposed adjacent to the second passivation layer 421. The dam structure 407a, 407b may be disposed adjacent to the bonding pad 411. The dam structure 407a, 407b may be disposed around the first through opening 403c of the cap layer 403. The dam structure 407a, 407b may surround the bonding pad 411. In some embodiments, the dam structure 407a, 407b is disposed on the second passivation layer 421 and surrounds the bonding pad 411. The space between the dam structure 407a, 407b and the bonding pad 411 may accommodate the conductive terminal 405 and prevent it from laterally expanding to the vicinity and contaminate an active region. The dam structure 407a, 407b may surround a portion of the conductive terminal 405 between the first die surface 401a of the semiconductor die 401 and the second cap surface 403b of the cap layer 403. In some embodiments, the dam structure 407a, 407b is disposed around the first through opening 403c of the cap layer 403.

In some embodiments, the conductive terminal 405 is disposed in the first through opening 403c of the cap layer 403 and the dam structure 407a, 407b surrounds a portion of the conductive terminal 405. By disposing the dam structure 407a, 407b around where the conductive terminal 405 is disposed on, the contamination that may be caused by disposing the conductive terminal 405 may be reduced by confining it in a limited space. The dam structure 407a, 407b may include, for example, a photoresist material, a polymeric material (e.g., benzocyclobutene (BCB)), an epoxy, or a metallic material (e.g., an eutectic alloy including, but not limited to, Au—In, Cu—Sn, Au—Sn, Au—Ge, Au—Si, Al—Ge, Al—Si). Eutectic alloys possess greater bonding strength than the polymeric counterpart while occupying less area between the cap layer 403 and the semiconductor die 401.

Figure 5A:
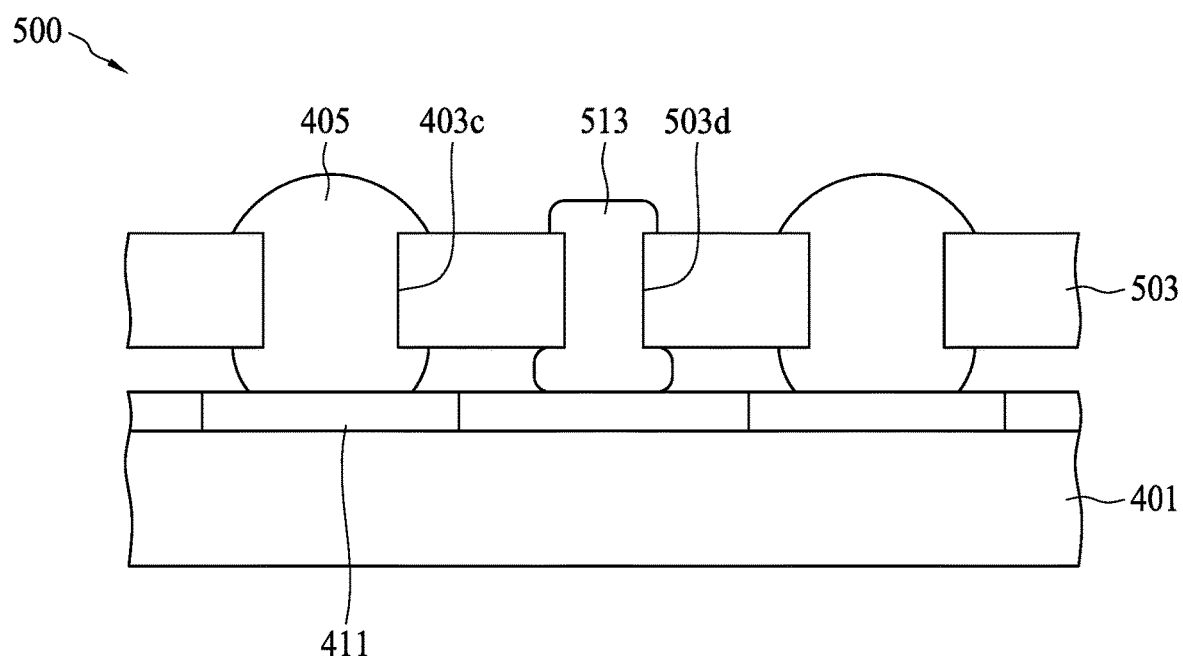
FIG. 5A illustrates a cross-sectional view of a semiconductor package according to an embodiment of the present disclosure.

FIG. 5A illustrates a cross-sectional view of a semiconductor package 500 according to an embodiment of the present disclosure. The semiconductor package 500 is similar to that illustrated in FIG. 4, with a difference including that a bonding structure 513 is disposed between the semiconductor die 401 and the cap layer 503 and the dam structure around the conductive terminal 405 may be omitted. The bonding structure 513 is disposed surrounding the semiconductor die 401. In some embodiments, the bonding structure 513 is disposed at the periphery of the semiconductor die 401. In some embodiments, the bonding structure 513 is disposed adjacent to the cutting edge for individualizing the semiconductor die 401. In some embodiments, the cap layer 503 defines a second through hole 503d and the bonding structure 513 is disposed in the second through hole 503d of the cap layer 503. The cap layer 503 may be bonded to the semiconductor die 401 through the bonding structure 513. In some embodiments where the bonding structure 513 is disposed adjacent to the cutting edge of the semiconductor die 401, the bonding structure 513 may prevent the semiconductor die 401 from contamination from the debris produced during the cutting process (e.g., a singulation process). The bonding structure 513 may include, for example, a photoresist material, a polymer material (e.g., benzocyclobutene (BCB)), an epoxy, a metal, or a combination thereof.

Figure 5B:
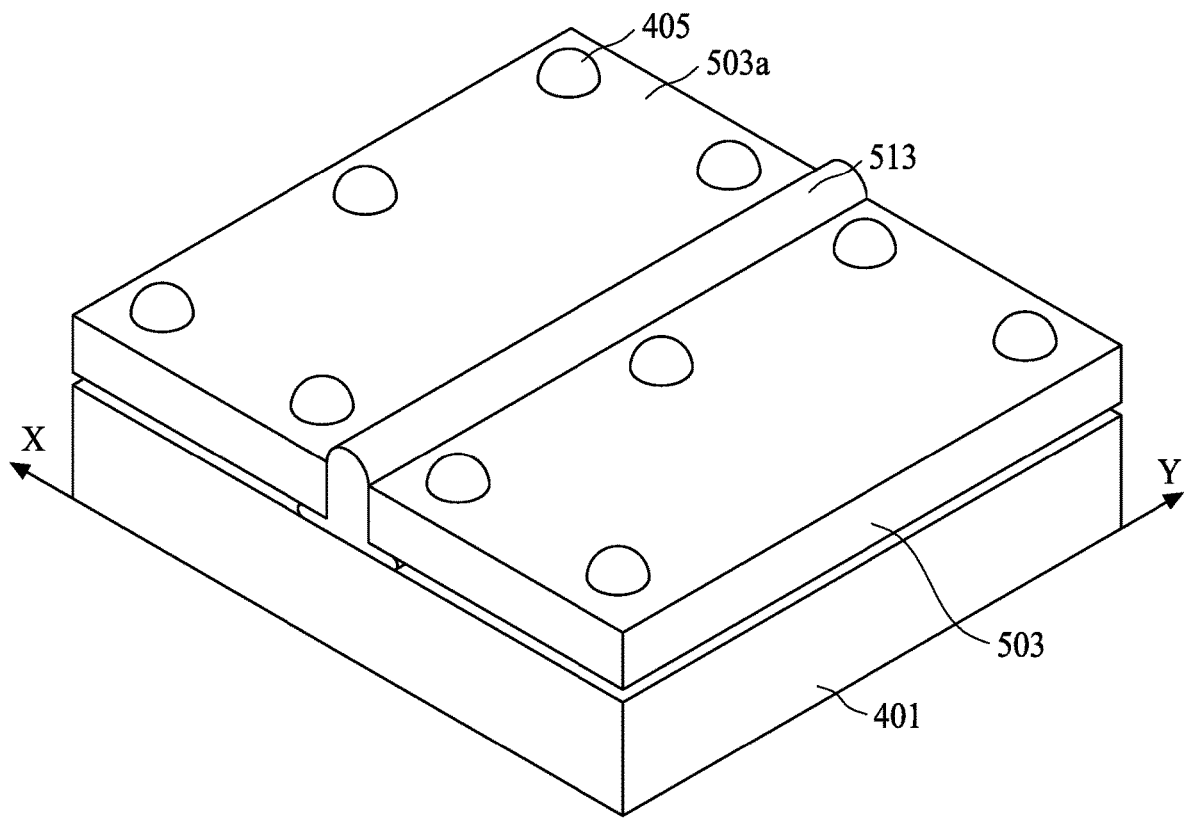
FIG. 5B illustrates a perspective view of a quarter of a complete semiconductor package such as the one illustrated in FIG. 5A.

FIG. 5B illustrates a perspective view of a quarter of a complete semiconductor package such as the one illustrated in FIG. 5A, dissecting along two symmetrical axes, for example, X and Y, for the purpose of description. In FIG. 5B, the cap layer 503 is stacked on the semiconductor die 401 with the bonding structure 513 therebetween. The conductive terminal 405 protrudes from the first cap surface 503a of the cap layer 503 and electrically connects to the bonding pad 411 (shown in FIG. 5A) of the semiconductor die 401 by penetrating through the first through opening 403c (shown in FIG. 5A) of the cap layer 503. The bonding structure 513 is disposed adjacent to the cutting edge of the semiconductor die 401 and separating different semiconductor dies.

Figure 6:
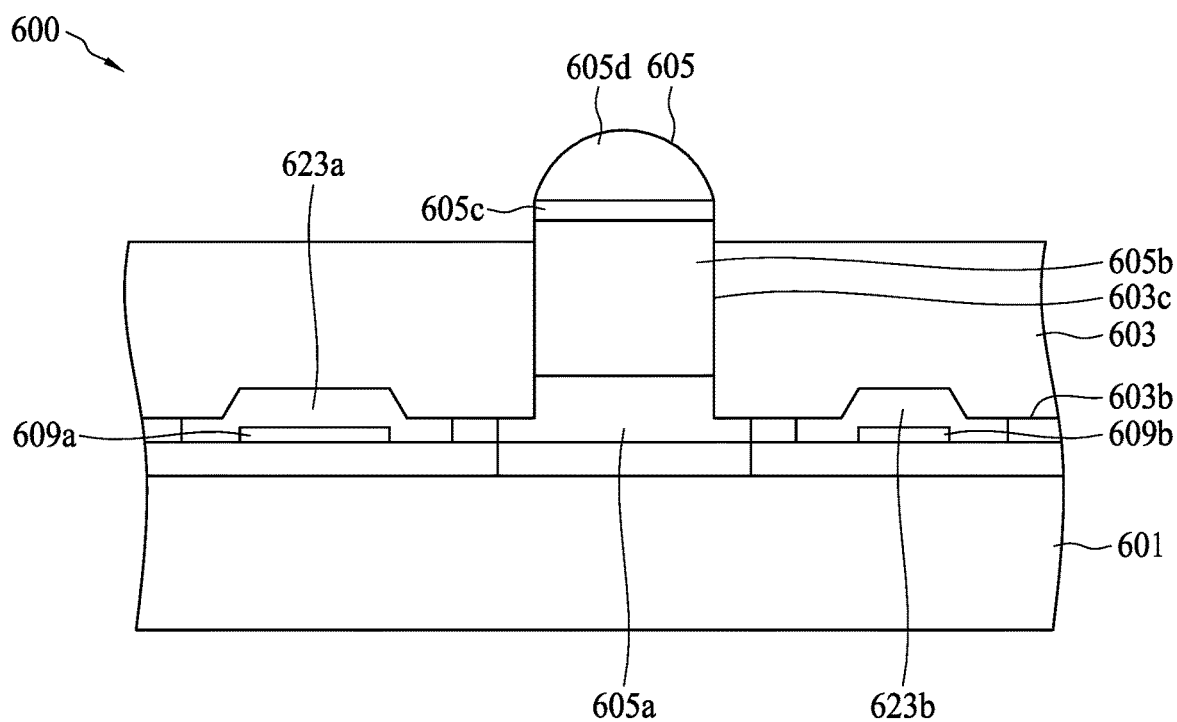
FIG. 6 illustrates a cross-sectional view of a semiconductor package according to an embodiment of the present disclosure.

FIG. 6 illustrates a cross-sectional view of a semiconductor package 600 according to an embodiment of the present disclosure. The semiconductor package 600 is similar to that illustrated in FIG. 1, with a difference including that the conductive terminal 605 is a pillar structure, which may include an under bump metallization (UBM) layer 605a, a pillar 605b, a barrier layer 605c, and a solder layer 605d, and at least one cavity 623a, 623b is disposed at the second cap surface 603b of the cap layer 603.

The UBM layer 605a may include, for example, a solder material. The pillar 605b may include, for example, a copper. The barrier layer 605c may include, for example, a nickel. The solder layer 605d may include, for example, a solder ball.

The cavity 623a, 623b is formed at the second cap surface 603b of the cap layer 603 and corresponding to the respective active region 609a, 609b of the semiconductor die 601 for accommodating the active region 609a, 609b, respectively. The cavity 623a, 623b is formed to compensate the height lost between the cap layer 603 and the semiconductor die 601 caused by disposing the conductive terminal 605 as a pillar structure. In other words, in some embodiments where the conductive terminal 605 is disposed as a pillar structure, a cavity 623a, 623b may be provided in order to have sufficient space to accommodate the active region 609a, 609b of the semiconductor die 601.

Figure 7:
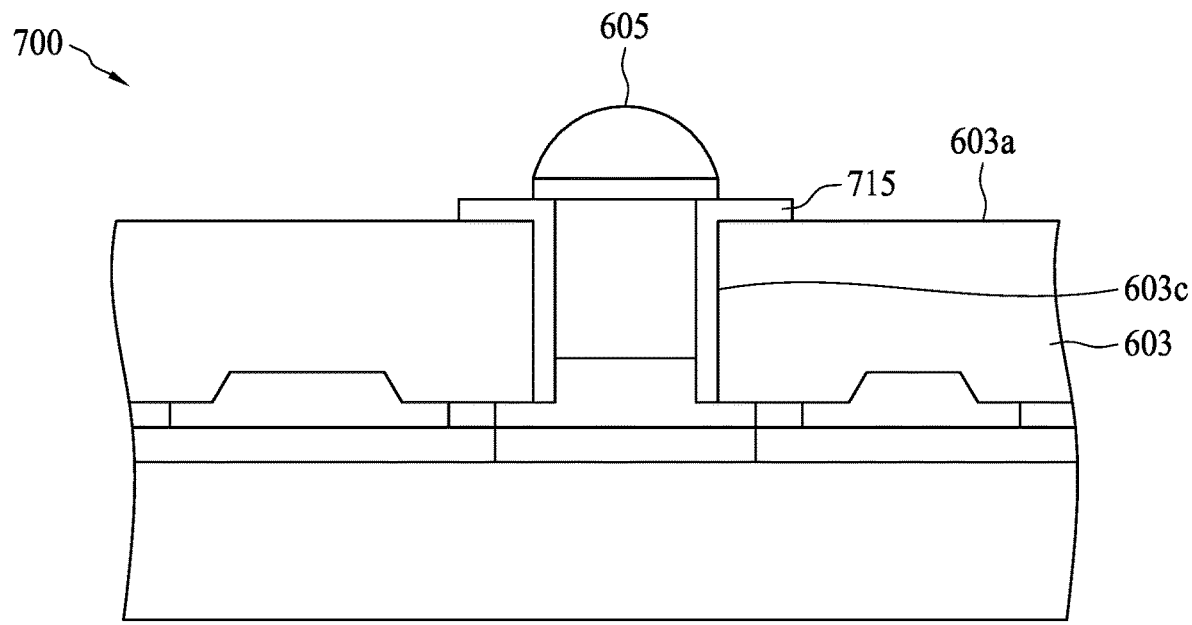
FIG. 7 illustrates a cross-sectional view of a semiconductor package according to an embodiment of the present disclosure.

FIG. 7 illustrates a cross-sectional view of a semiconductor package 700 according to an embodiment of the present disclosure. The semiconductor package 700 is similar to that illustrated in FIG. 6, with a difference including that an isolation layer 715 is disposed between the conductive terminal 605 and the cap layer 603. In some embodiments, the isolation layer 715 is in line with a sidewall of the first through opening 603c of the cap layer 603. In some embodiments, the isolation layer 115 is in line with a sidewall of the first through opening 603c and extends over the first cap surface 603a of the cap layer 603. The isolation layer 715 may include, for example, a polymeric material (e.g., polybenzoxazole (PBO). The isolation layer 715 may provide better wetting property of the conductive terminal 605 and therefore better adhesion property between the conductive terminal 605 and the cap layer 603. Alternatively, the isolation layer 715 can be omitted when the cap layer 603 is composed of high resistive silicon or glass.

FIGS. 8A-8M illustrate a method for manufacturing a semiconductor package such as the semiconductor package 100 of FIG. 1.

Figure 8A:
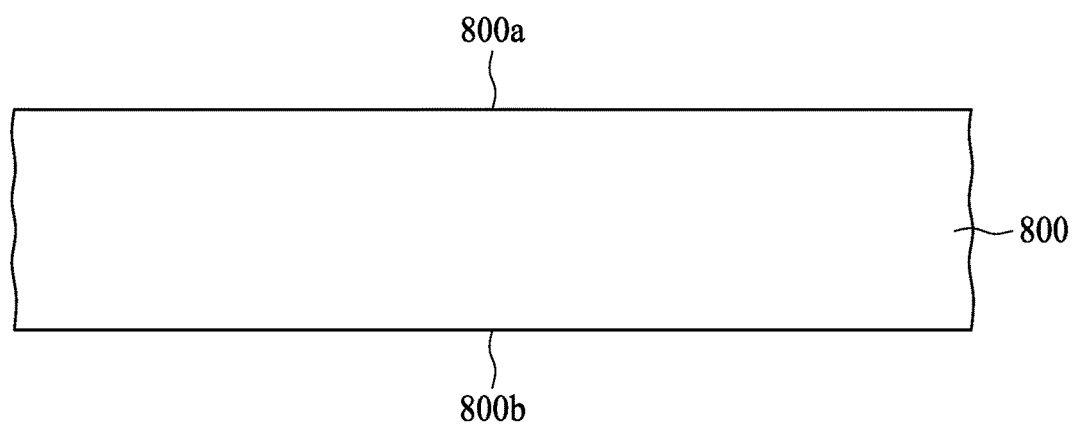
FIG. 8A, FIG. 8B, FIG. 8C, FIG. 8D, FIG. 8E, FIG. 8F, FIG. 8G, FIG. 8H, FIG. 8I, FIG. 8J, FIG. 8K, FIG. 8L, and FIG. 8M illustrate a method for manufacturing a semiconductor package such as the semiconductor package of FIG. 1.

Referring to FIG. 8A, a cap layer 800 is provided. The cap layer 800 has a first cap surface 800a and a second cap surface 800b opposite to the first cap surface 800a. The cap layer 800 may be a semiconductor wafer. The semiconductor wafer 800 can be composed of silicon, high resistive silicon (undoped silicon), or other III-V compound materials.

Figure 8B:
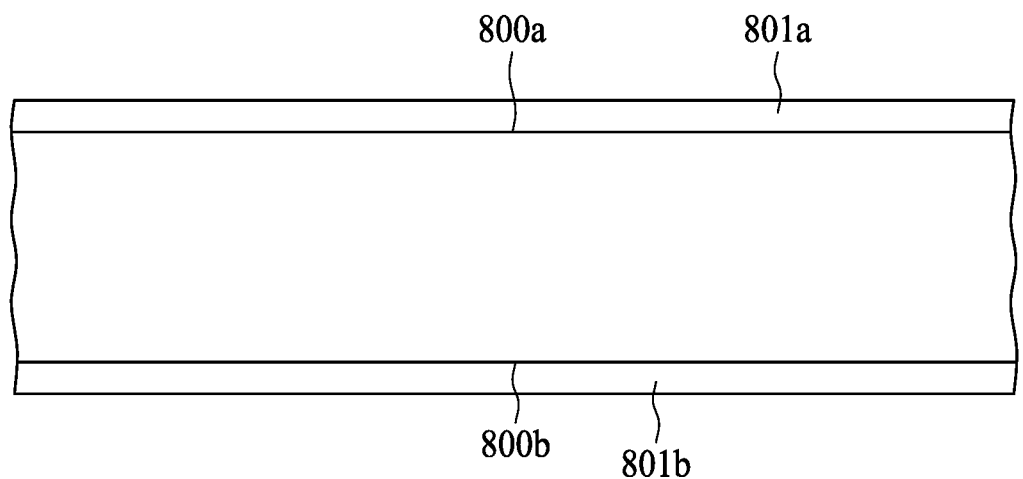

Referring to FIG. 8B, a passivation layer 801a, 801b is formed over the first cap surface 800a and the second cap surface 800b of the cap layer 800, respectively. In some embodiments, the passivation layer 801a, 801b is formed by a thermal oxidation operation, a nitride low-pressure chemical vapor deposition operation, or the combination thereof.

Figure 8C:
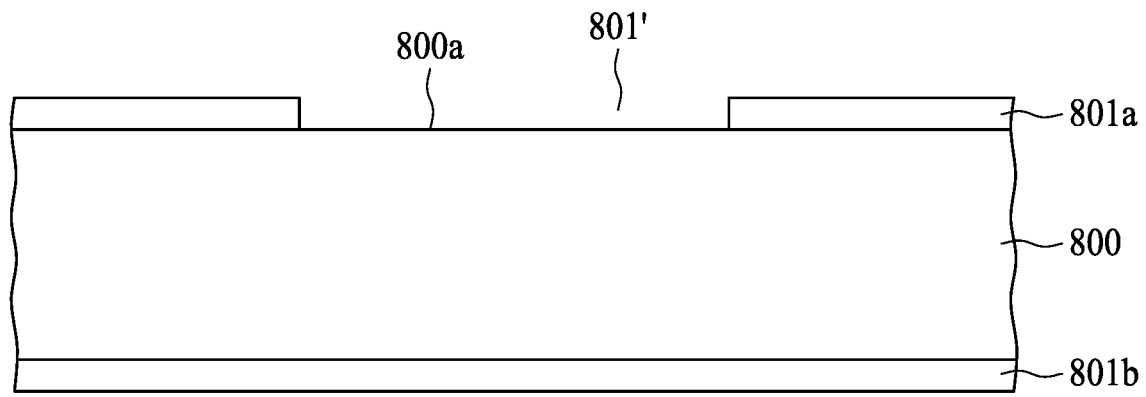

Referring to FIG. 8C, an opening 801' is formed at the passivation layer 801a on the first cap surface 800a of the cap layer 800, which exposes the underlying cap layer 800. In some embodiments, a photolithography process and an etching process are performed to remove a predetermined portion of the passivation layer 801a to form the opening 801'.

Figure 8D:
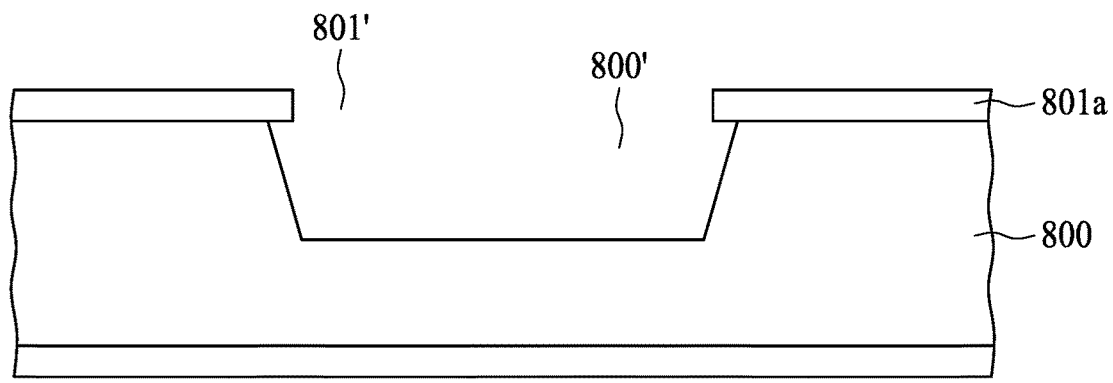

Referring to FIG. 8D, a cavity 800' is formed from the opening 801' of the cap layer 800. In some embodiments, a wet etching process is performed to form the cavity 800'. Due to the type of the etching process selected, a portion of the passivation layer 801a may be remained and protruded over the cavity 800'.

Figure 8E:
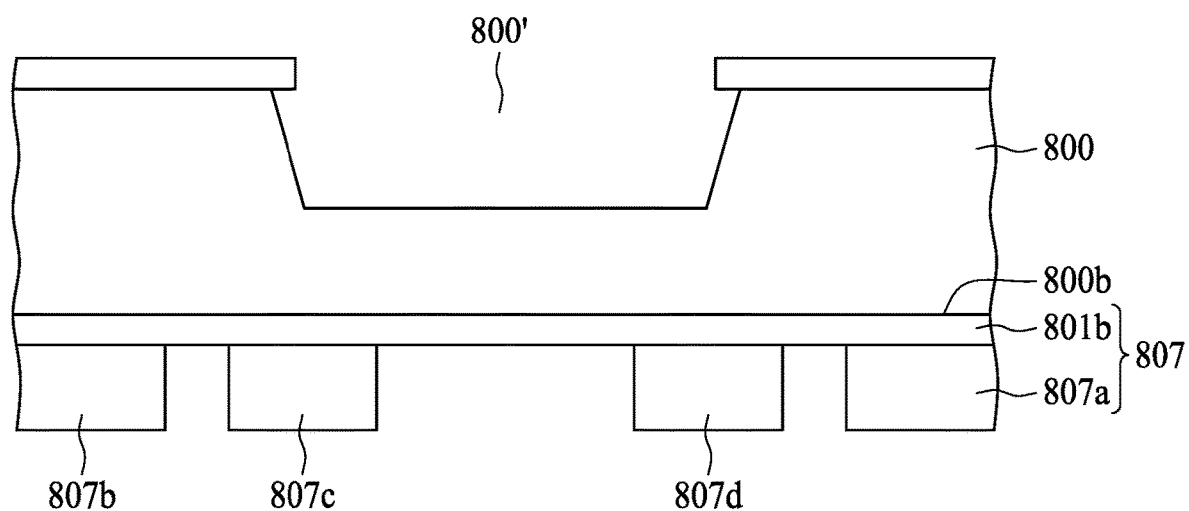

Referring to FIG. 8E, a bonding layer 807 is formed adjacent to the second cap surface 800b of the cap layer 800, for example, on the passivation layer 801b. In some embodiments, the bonding layer 807 includes a bonding structure 807a, 807b and a dam structure 807c, 807d. The dam structure 807c, 807d is closer to the cavity 800' than the bonding structure 807a, 807b. In some embodiments, the bonding layer 807 can be composed of photoresist materials (e.g., SU-8), polymeric materials (e.g., benzocyclobutene (BCB)), epoxies, or the like, and the bonding layer 807 can be patterned directly on the passivation layer 801b on the second cap surface 800b of the cap layer 800. In some embodiments, the bonding layer 807 can be composed of metallic materials such as eutectic alloys including, but not limited to, Au—In, Cu—Sn, Au—Sn, Au—Ge, Au—Si, Al—Ge, Al—Si, and is deposited, sputtered, or plated on the second cap surface 800b of the cap layer 800.

Figure 8F:
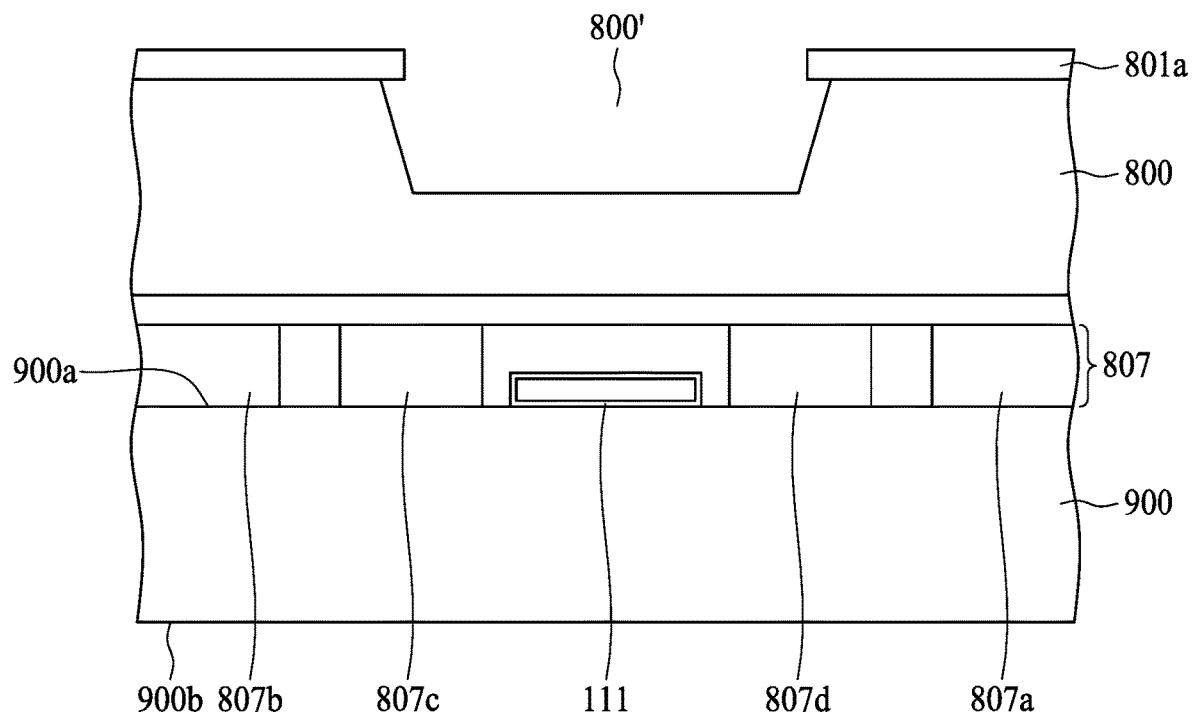

Referring to FIG. 8F, the cap layer 800 is bonded to a semiconductor wafer 900 via the bonding layer 807. The semiconductor wafer 900 has a first wafer surface 900a and a second wafer surface 900b opposite to the first wafer surface 900a. The semiconductor wafer 900 may include at least one semiconductor die, including, for example, a communication chip, a microprocessor chip, a graphics chip, or a MEMS chip. A bonding pad 111 is provided on the first wafer surface 900a of the semiconductor wafer 900, which is aligned with the cavity 800', configured to receive a conductive terminal passing through the cap layer 800. The dam structure 807c, 807d is closer to the bonding pad 111 than the bonding structure 807a, 807b.

Figure 8G:
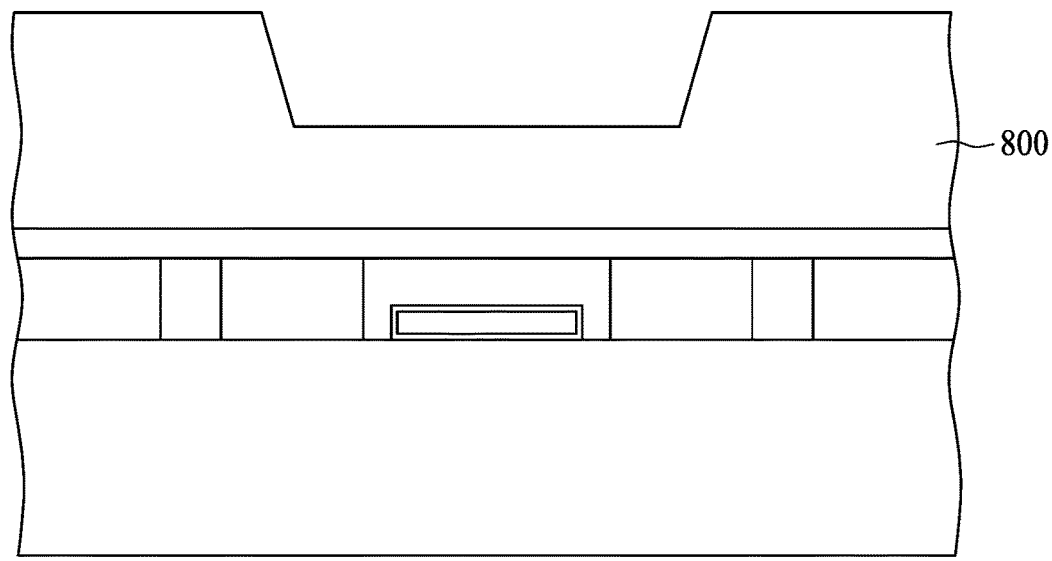

Referring to FIG. 8G, the passivation layer 801a shown in FIG. 8F is removed, and a total thickness of the cap layer 800 is reduced down to, for example, 20 µm. In some embodiments, the passivation layer 801a and the thickness of the cap layer 800 can be removed by grinding.

Figure 8H:
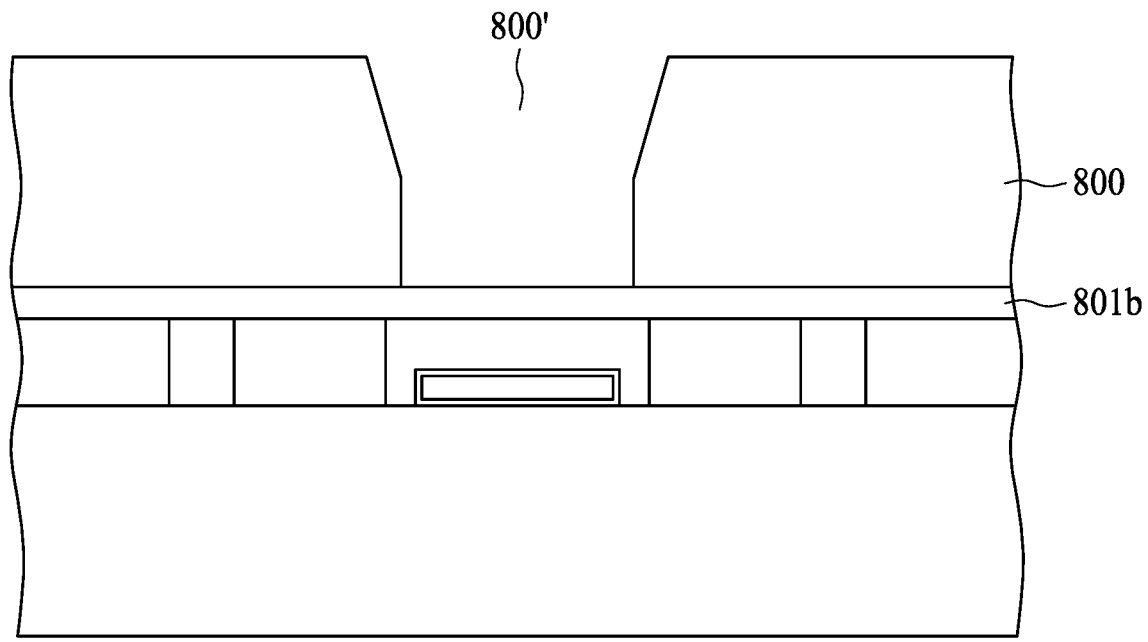

Referring to FIG. 8H, a portion of the cap layer 800 under the cavity 800' is removed until the passivation layer 801b is exposed. In some embodiments, the removal of the portion of the cap layer 800 can be performed by a dry etching process.

Figure 8I:
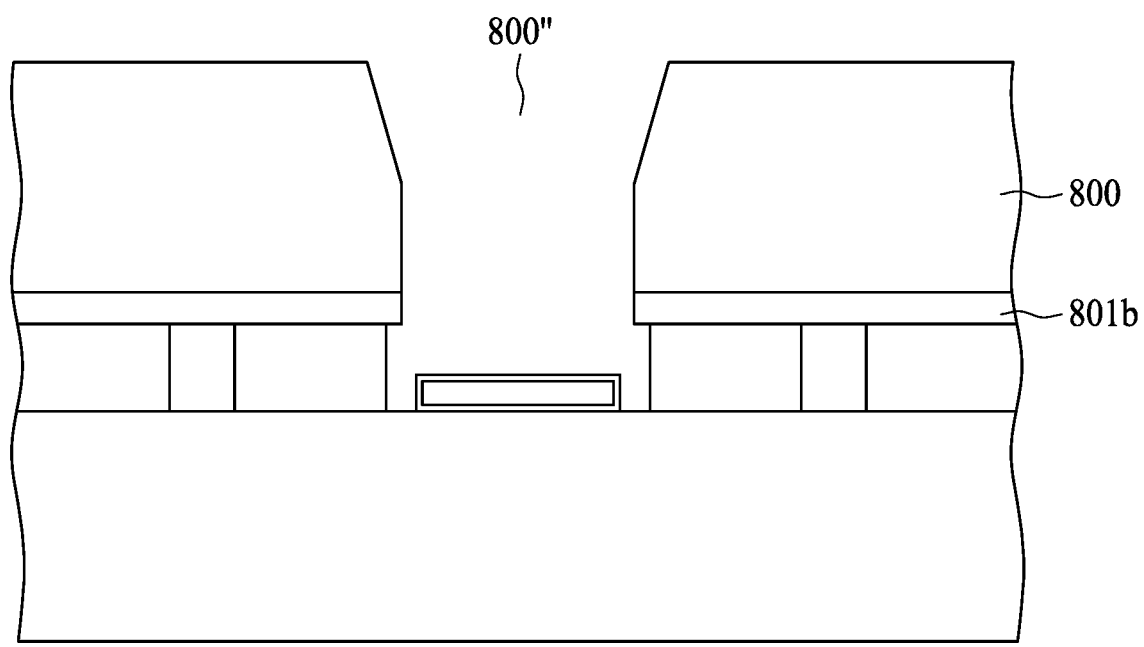

Referring to FIG. 8I, the portion of the passivation layer 801b exposed by the cavity 800' is removed. In some embodiments, the removal of the portion of the passivation layer 801b is performed by a self-aligned etching process by, for example, a reactive ion etch (ME) process. Subsequently, a first through opening 800" can be formed in the cap layer 800.

Figure 8J:
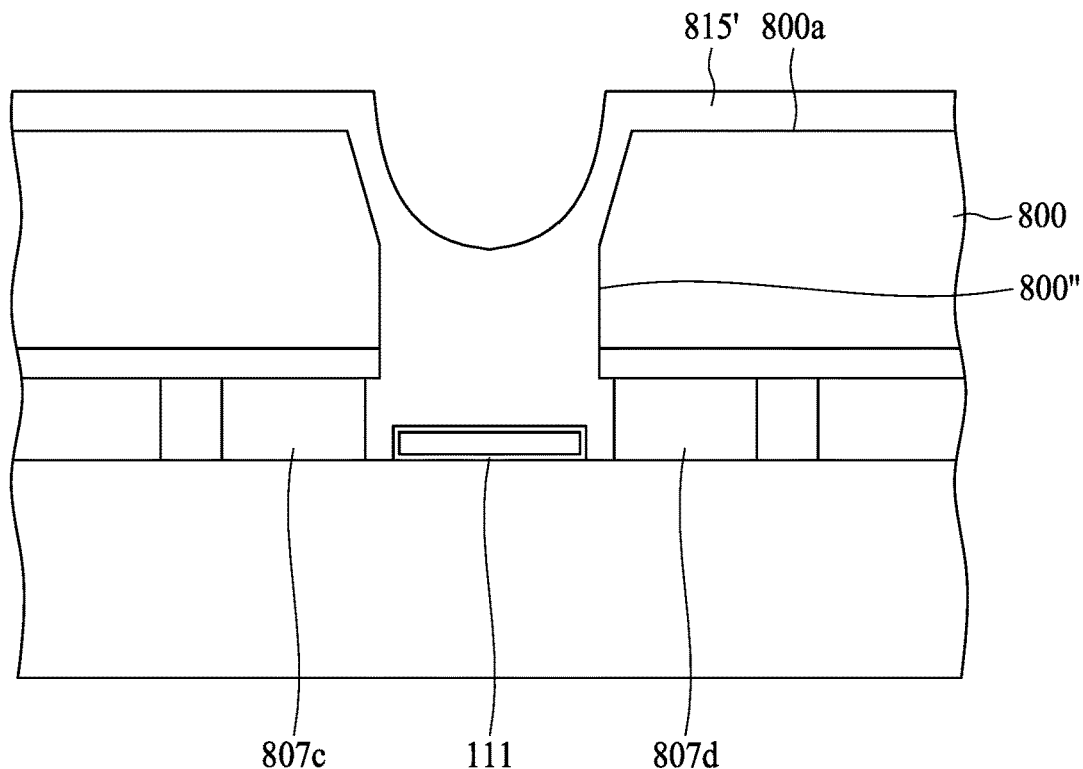

Referring to FIG. 8J, an isolation material 815' is disposed in the first through opening 800" and over the first cap surface 800a of the cap layer 800. The isolation material 815' may fill the space between the dam structure 807c, 807d and cover the bonding pad 111. The isolation material 815' may be disposed by a spin coating technique or a spay technique.

Figure 8K:
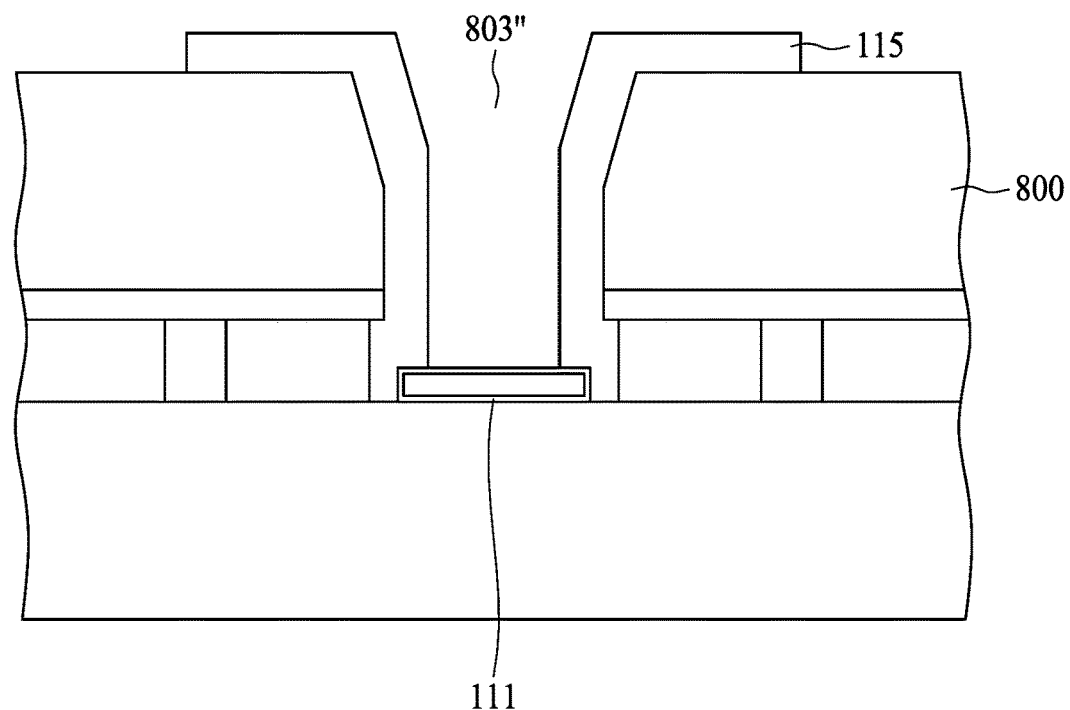

Referring to FIG. 8K, a portion of the isolation material 815' is removed, thereby exposing a portion of a surface of the bonding pad 111 and forming an isolation layer 115 and a second through opening 803". In some embodiments, a horizontal portion of the isolation material 815' is removed. In some embodiments, the removal of the portion of the isolation material 815' is performed by a combination of a photolithography and an etching technique.

Figure 8L:
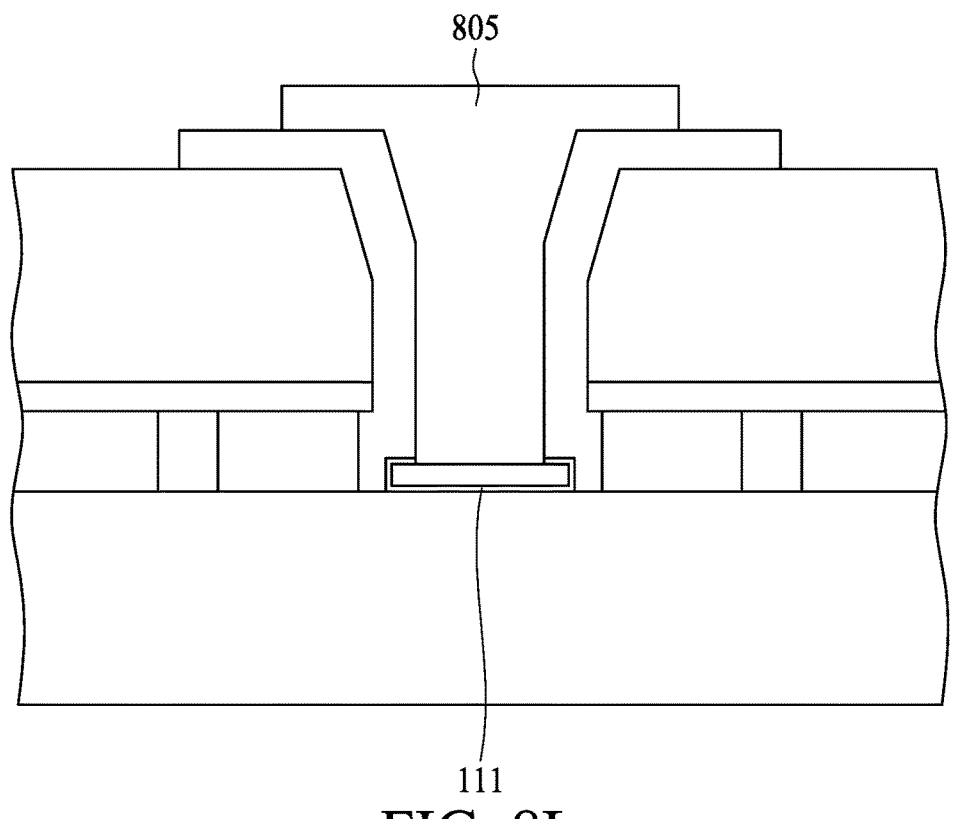

Referring to FIG. 8L, a conductive terminal 805 is formed in the second through opening 803" of the semiconductor wafer 900. In some embodiments, the conductive terminal 805 is a solder layer, which can be formed by a solder ball placement technique or a solder paste printing technique.

Figure 8M:
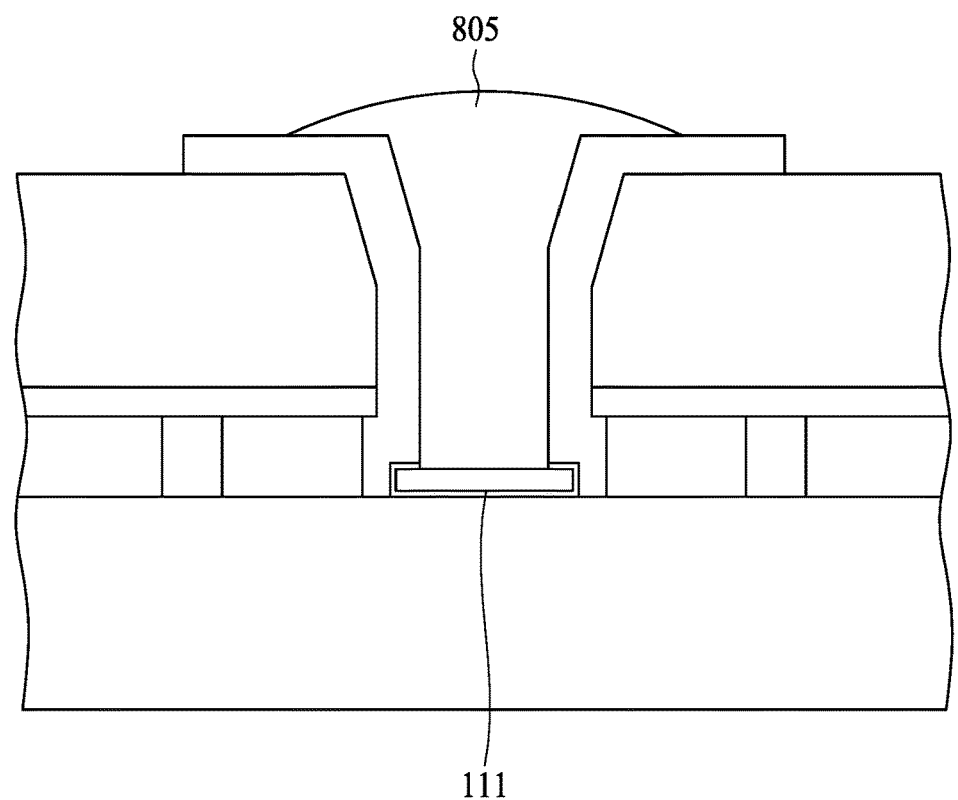

Referring to FIG. 8M, in some embodiments where the conductive terminal 805 is a solder layer, a solder ball may be formed by a reflowing process, which electrically connects to the bonding pad 111. Subsequently, a semiconductor package, such as the one illustrated in FIG. 1, may be obtained.

FIGS. 8A-8K and FIG. 8N-8Q illustrate a method for manufacturing a semiconductor package such as the semiconductor package 300 of FIG. 3.

FIGS. 8A-8K illustrate the same process as those addressed in FIGS. 8A-8K above and thus are not is not repeated here for brevity.

Figure 8N:
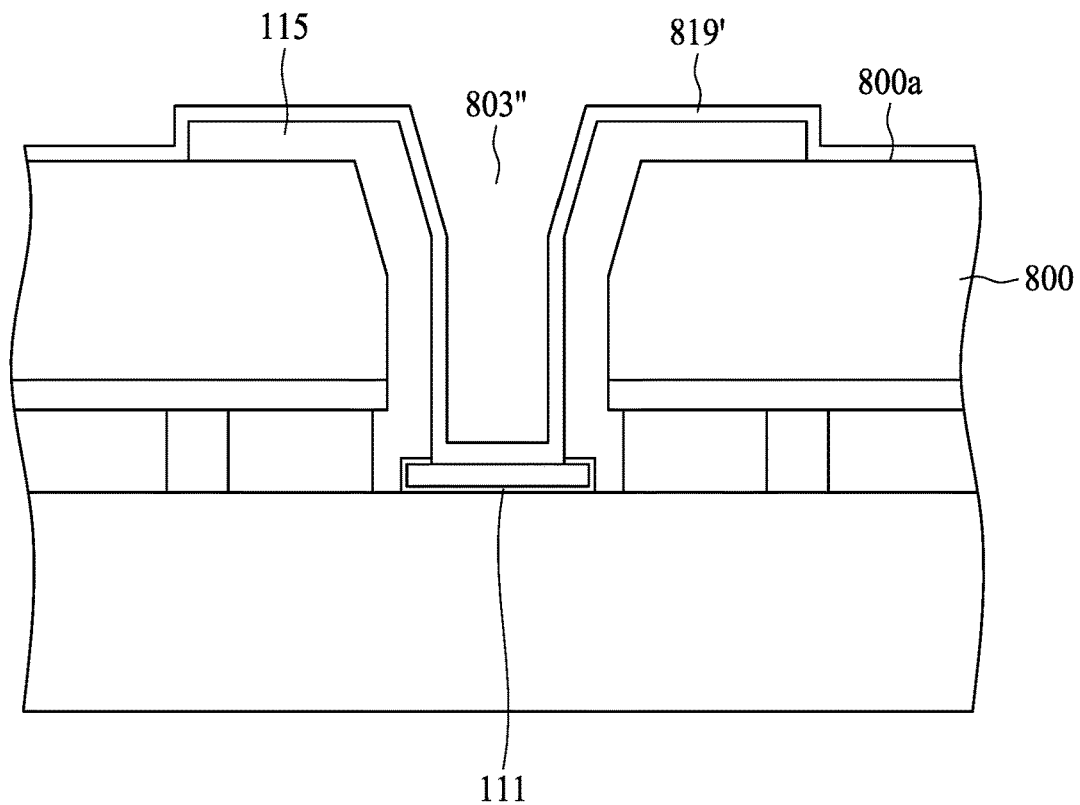

Referring to FIG. 8N, a metal layer 819' is disposed in the second through opening 803" of the cap layer 800. In some embodiments, the metal layer 819' is disposed in conformity with the isolation layer 115, covering a portion of a surface of the bonding pad 111, and covering at least a portion of the first cap surface 800a of the cap layer 800. The metal layer 819' may be disposed by a physical vapor deposition (PVD) technique. The metal layer 819' provides better wetting property for the subsequently formed conductive terminal 805.

Figure 8O:
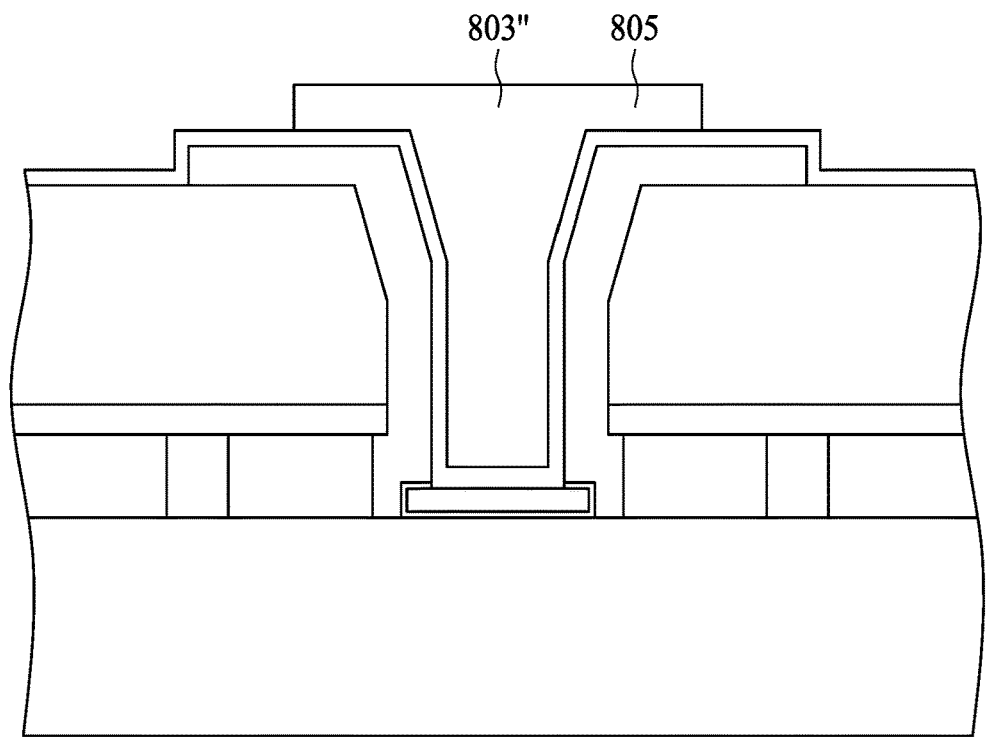

Referring to FIG. 8O, a conductive terminal 805 is formed in the second through opening 803". In some embodiments, the conductive terminal 805 is a solder layer, which can be formed by a solder ball placement technique or a solder paste printing technique.

Figure 8P:
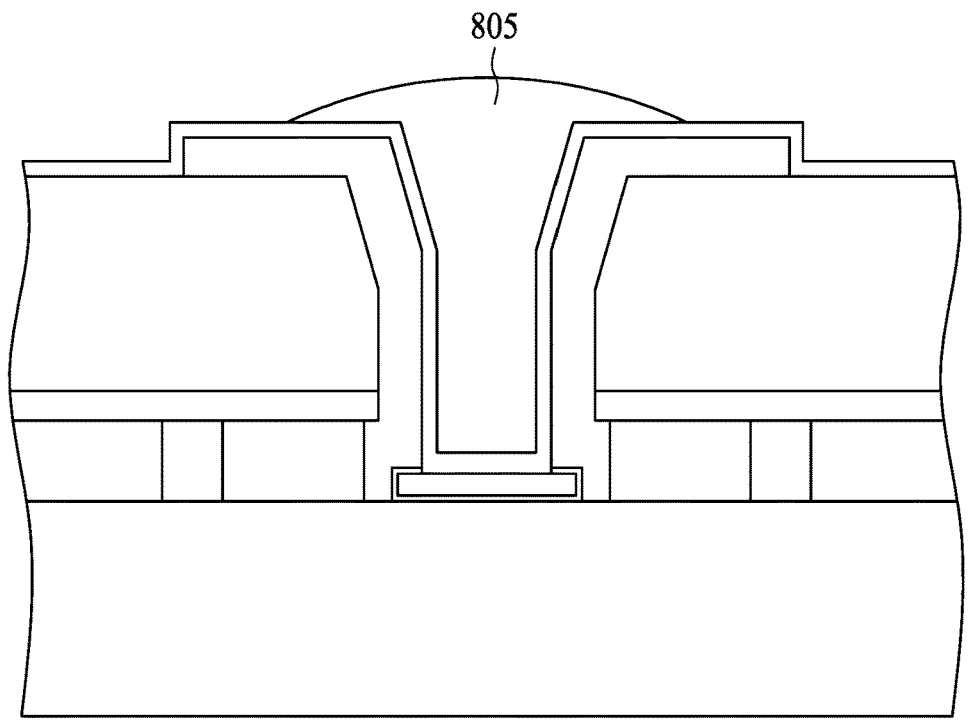

Referring to FIG. 8P, in some embodiments where the conductive terminal 805 is a solder layer, a solder ball may be formed by a reflowing process.

Figure 8Q:
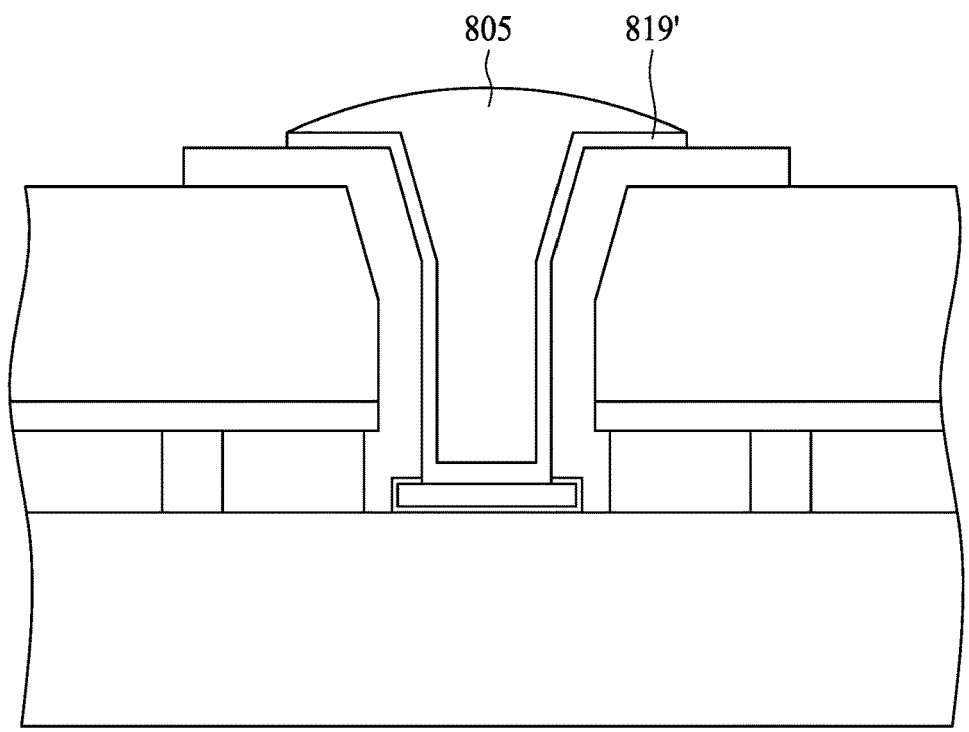

Referring to FIG. 8Q, a portion of the metal layer 819' that is not covered by the solder ball 805 is removed. In some embodiments, a portion of the metal layer 819' can be removed by a wet etching technique. In some embodiments, the removal rage of the wet etching technique to the materials of the conductive terminal 805 is negligible compared to the metal layer 819'. Subsequently, a semiconductor package, such as the one illustrated in FIG. 3, may be obtained.

FIGS. 9A-9I illustrate a method for manufacturing a semiconductor package according to an embodiment of the present disclosure.

Referring to 9A, a cap layer 900 and a semiconductor wafer 902 are provided. The cap layer 900 has a first cap surface 900a and a second cap surface 900b opposite to the first cap surface 900a. In some embodiments, the cap layer 900 is a semiconductor wafer. The semiconductor wafer 900 can be composed of silicon, high resistive silicon (undoped silicon), or other III-V compound materials. The cap layer 900 is provided with a passivation layer 901 disposed adjacent to the second cap surface 900b of the cap layer 900 and a bonding layer 907 is disposed adjacent to a surface of the passivation layer 901. In some embodiments, the bonding layer 907 includes a dam structure 907a, 907b and a bonding structure 907c, 907d. The cap layer 900 is also provided with a first alignment mark 922a at the first cap surface 900a of the cap layer 900 corresponding to an alignment key 924 on the semiconductor wafer 902 to be bonded.

The semiconductor wafer 902 has a first wafer surface 902a and a second wafer surface 902b opposite to the first wafer surface 902a. The semiconductor wafer 900 may include at least one semiconductor die, including, for example, a communication chip, a microprocessor chip, a graphics chip, or a MEMS chip. A bonding pad 911 is provided on the first wafer surface 902a of the semiconductor wafer 902, configured to receive a conductive terminal passing through the cap layer 900. An alignment key 924 is disposed adjacent to the first wafer surface 902a of the semiconductor wafer 902 for alignment with the first alignment mark 922a.

Referring to 9B, the cap layer 900 is bonded to the semiconductor wafer 902 via the bonding structure 907c, 907d. In some embodiments, the dam structure 907a, 907b is partially deformed by the bonding pad 911. Alternatively stated, the dam structure 907a, 907b may cover a portion of the bonding pad 911.

Referring to 9C, a second alignment mark 922b is disposed on the second wafer surface 902b of the semiconductor wafer 902 to assist alignment.

Referring to 9D, a thinning process is performed from the first cap surface 900a of the cap layer 900 to reduce the thickness of the cap layer 900 down to, for example, 20 μm. In some embodiments, the thinning process is performed by, for example, a grinding technique. Since the first alignment mark 922a is removed when thinning the cap layer 900, the second alignment mark 922b formed on the second wafer surface 902b of the semiconductor wafer 902 may facilitate the wafer recognition in subsequent processes.

Referring to 9E, an opening 900' is formed in the cap layer 900 by, for example, a dry etching technique.

Referring to 9F, a portion of the passivation layer 901 is then removed by, for example, a self-aligned dry etch operation.

Figure 9A:
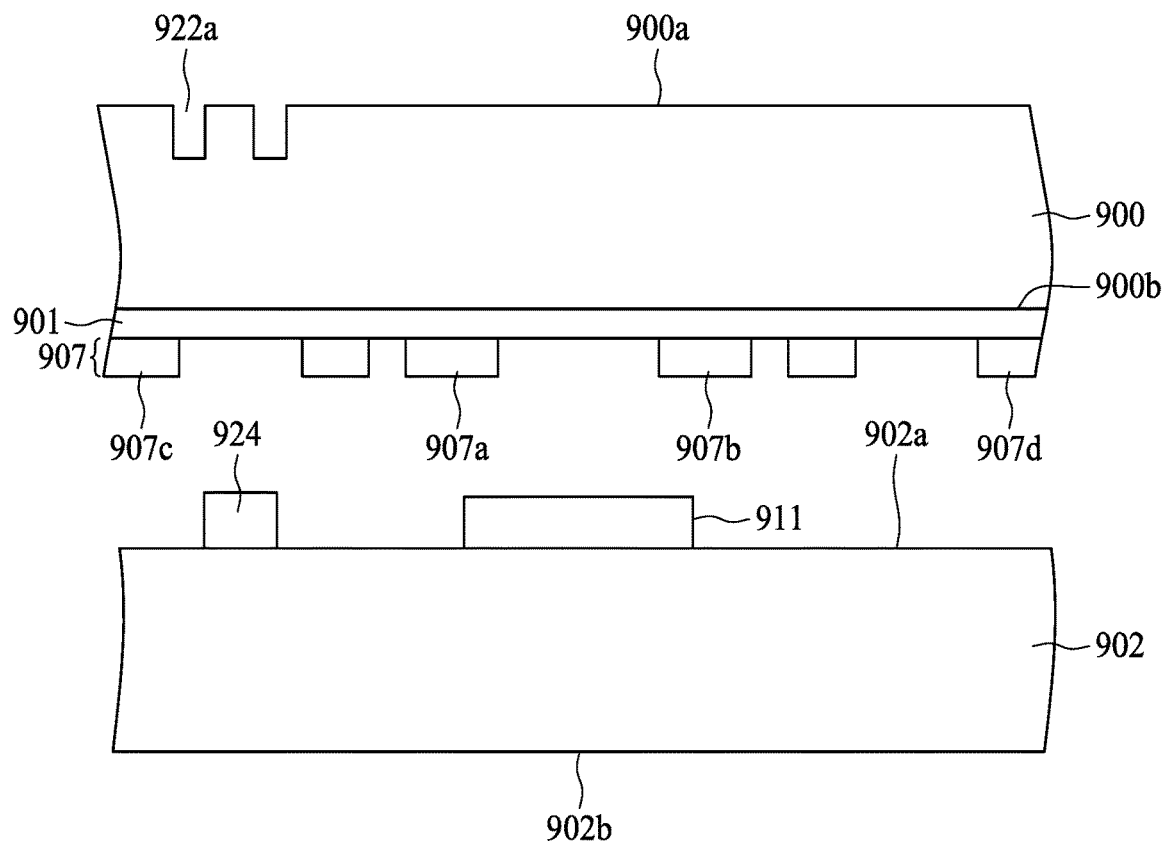
FIG. 9A, FIG. 9B, FIG. 9C, FIG. 9D, FIG. 9E, FIG. 9F, FIG. 9G, FIG. 9H, and FIG. 9I illustrate a method for manufacturing a semiconductor package according to an embodiment of the present disclosure.
Figure 9B:
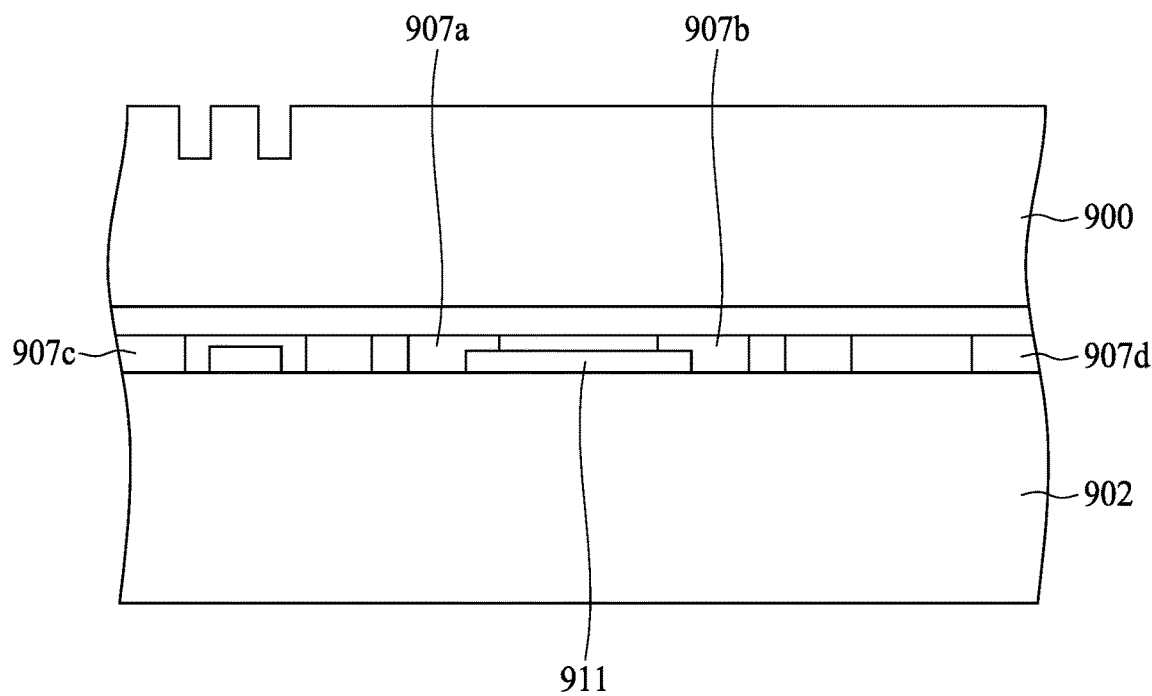
Figure 9C:
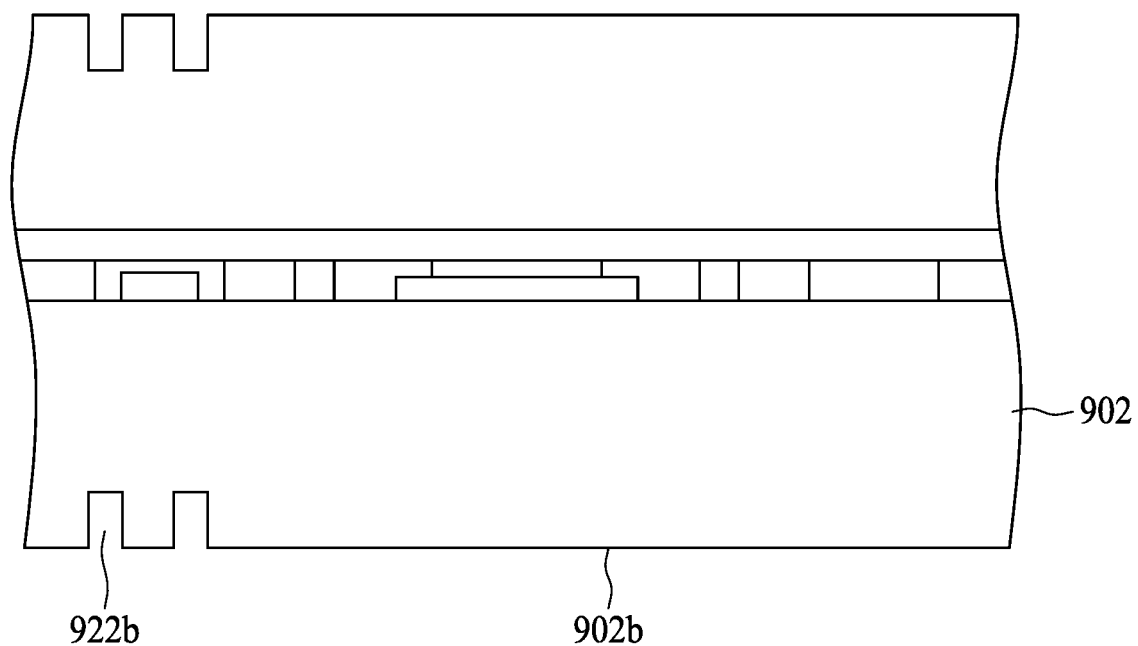
Figure 9D:
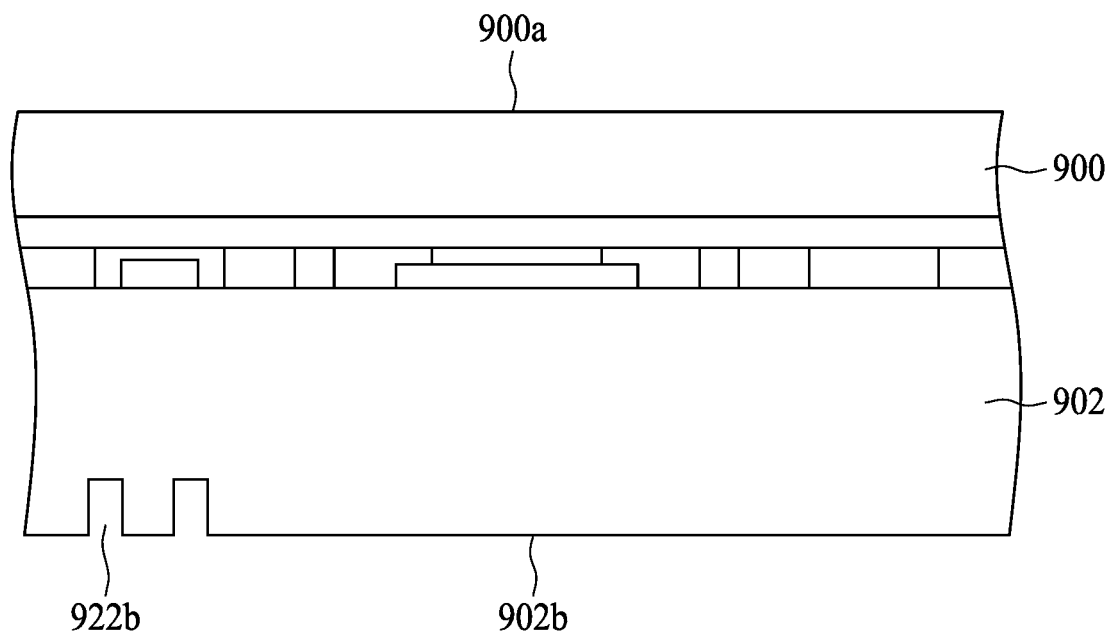
Figure 9E:
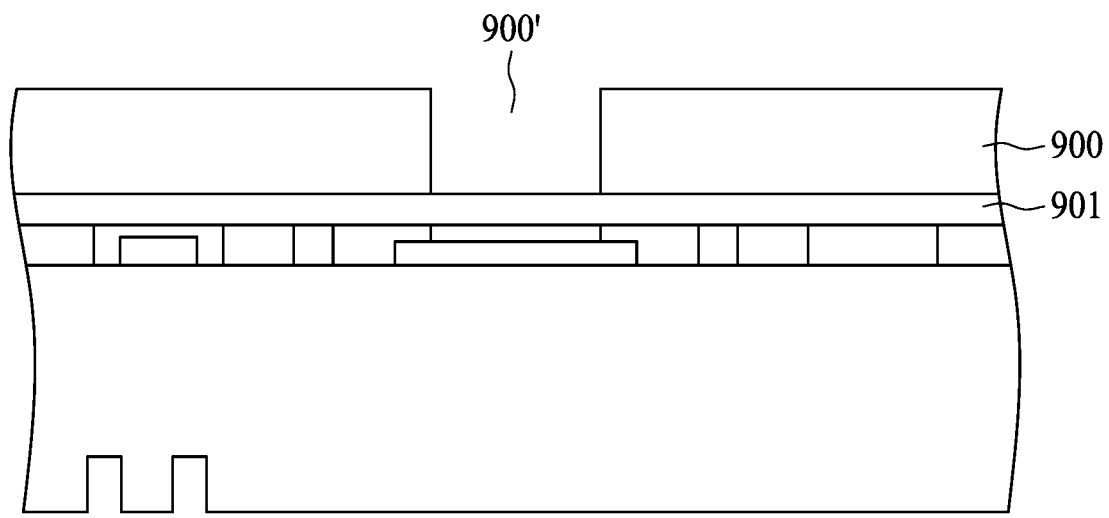
Figure 9F:
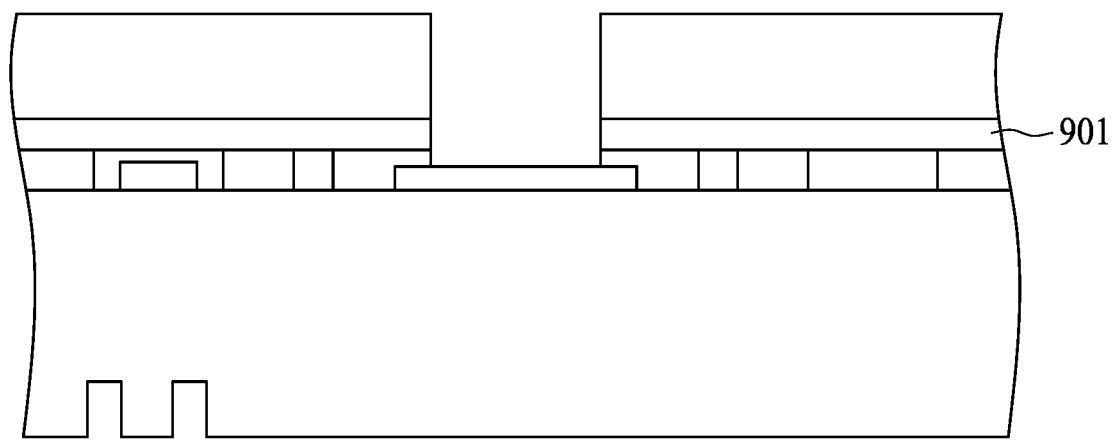
Figure 9G:
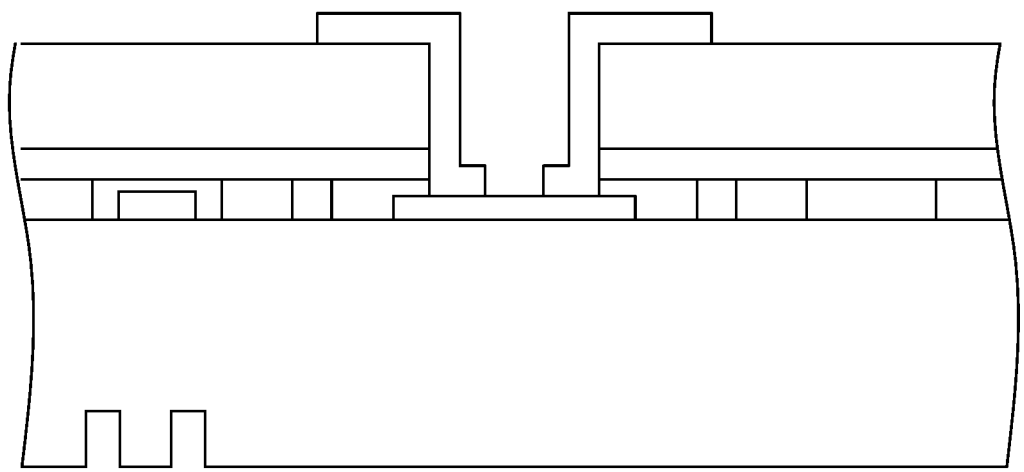
Figure 9H:
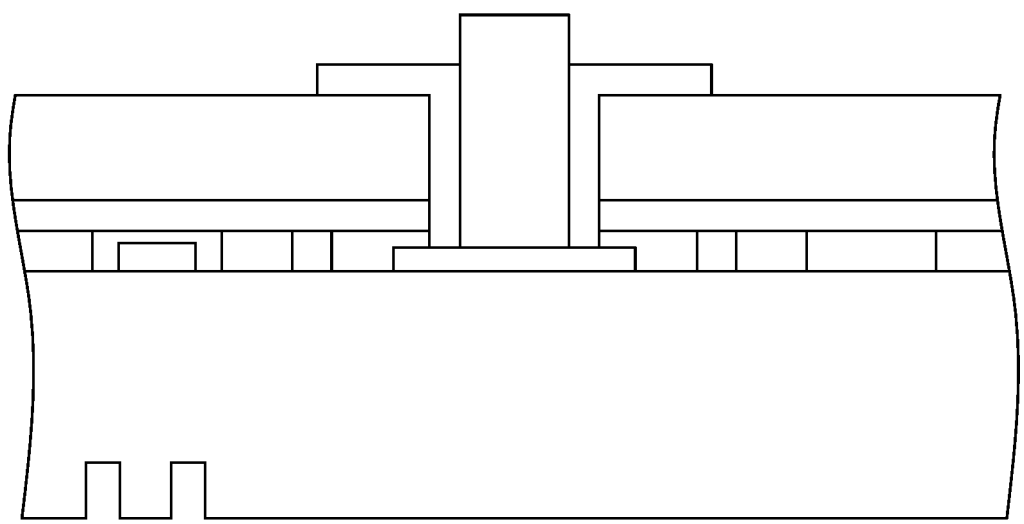
Figure 9I:
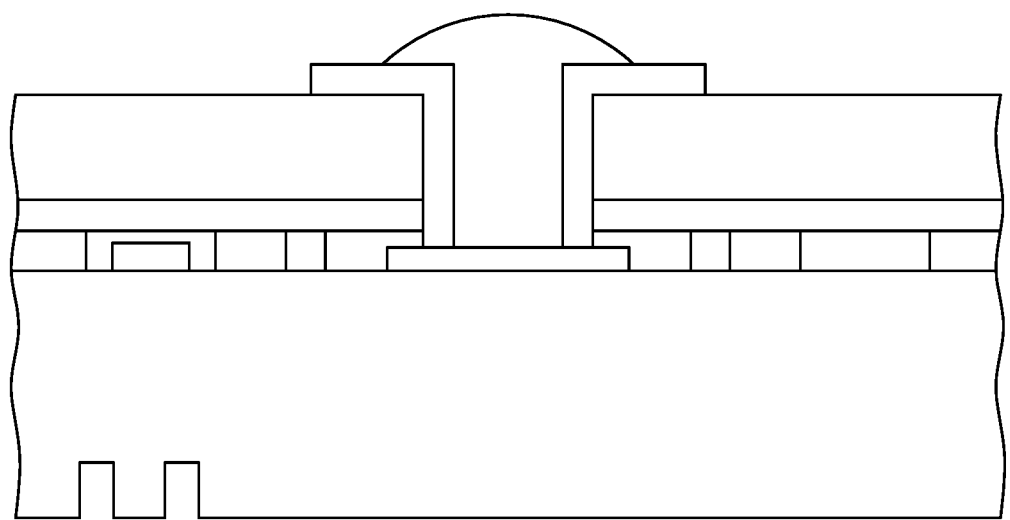

FIGS. 9G-9I illustrate the same process as those addressed in FIG. 8K, FIG. 8L, and FIG. 8M above and thus are not repeated here for brevity.

FIGS. 10A-10K illustrate a method for manufacturing a semiconductor package according to an embodiment of the present disclosure.

Figure 10A:
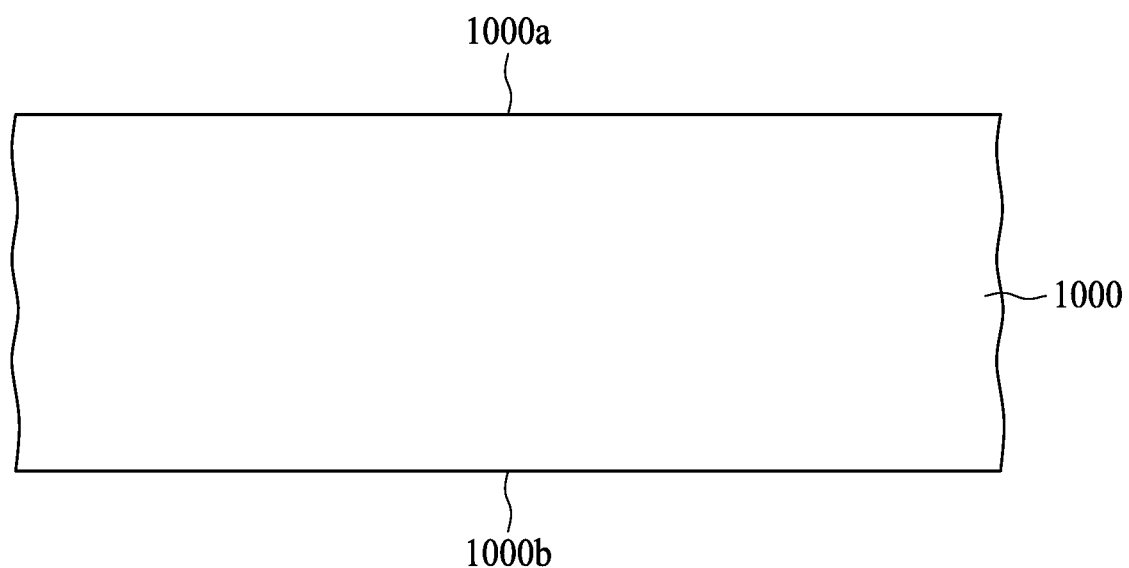
FIG. 10A, FIG. 10B, FIG. 10C, FIG. 10D, FIG. 10E, FIG. 10F, FIG. 10G, FIG. 10H, FIG. 10I, FIG. 10J, and FIG. 10K illustrate a method for manufacturing a semiconductor package according to an embodiment of the present disclosure.

Referring to FIG. 10A, a cap layer 1000 is provided. The cap layer 1000 has a first cap surface 1000a and a second cap surface 1000b opposite to the first cap surface 1000a. The cap layer 1000 may be a semiconductor wafer. The semiconductor wafer 1000 can be composed of silicon, high resistive silicon (undoped silicon), or other III-V compound materials.

Figure 10B:
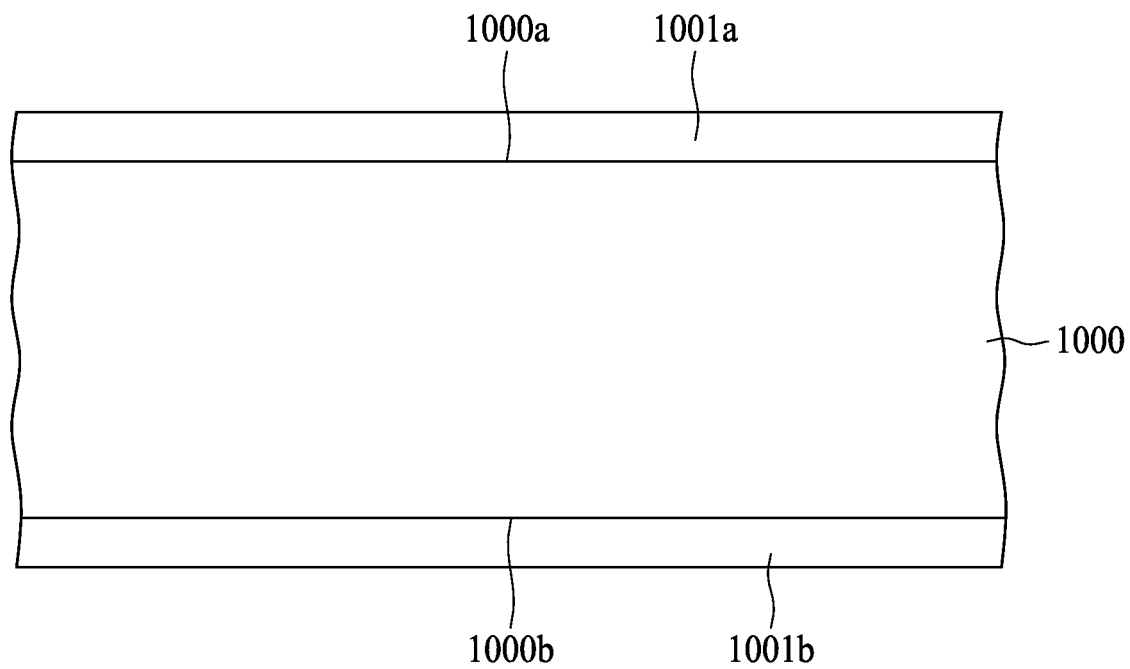

Referring to FIG. 10B, a passivation layer 1001a, 1001b is formed over the first cap surface 1000a and the second cap surface 1000b of the cap layer 1000, respectively. In some embodiments, the passivation layer 1001a, 1001b is formed by a thermal oxidation operation, a nitride low-pressure chemical vapor deposition operation, or the combination thereof.

Figure 10C:
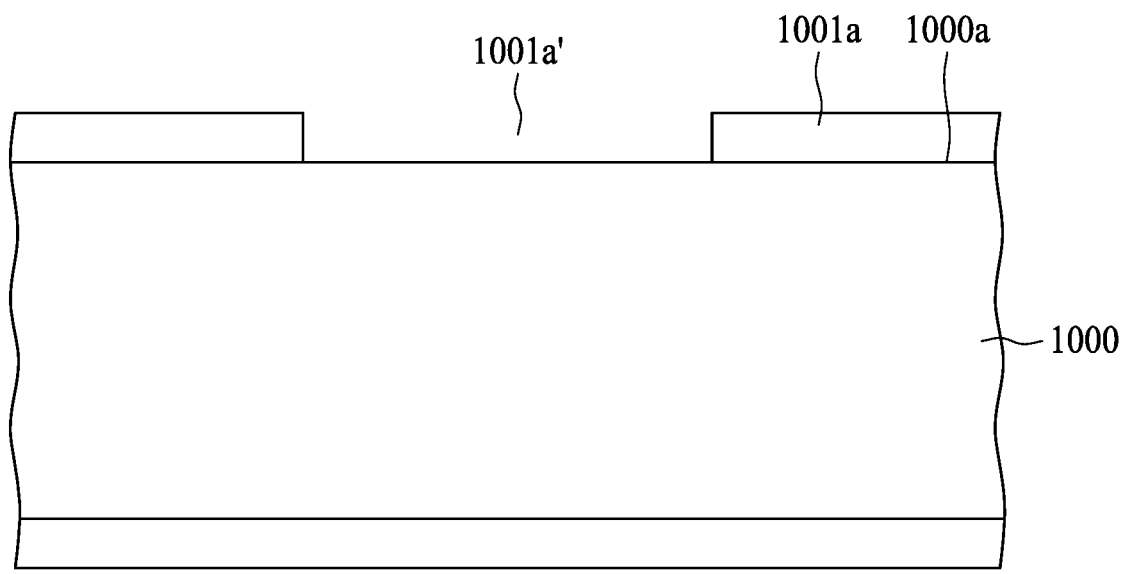

Referring to FIG. 10C, an opening 1001a' is formed on the passivation layer 1001a on the first cap surface 1000a of the cap layer 1000, which exposes the underlying cap layer 1000. In some embodiments, a photolithography process and an etching process are performed to remove a predetermined portion of the passivation layer 1001a to form the opening 1001a'.

Figure 10D:
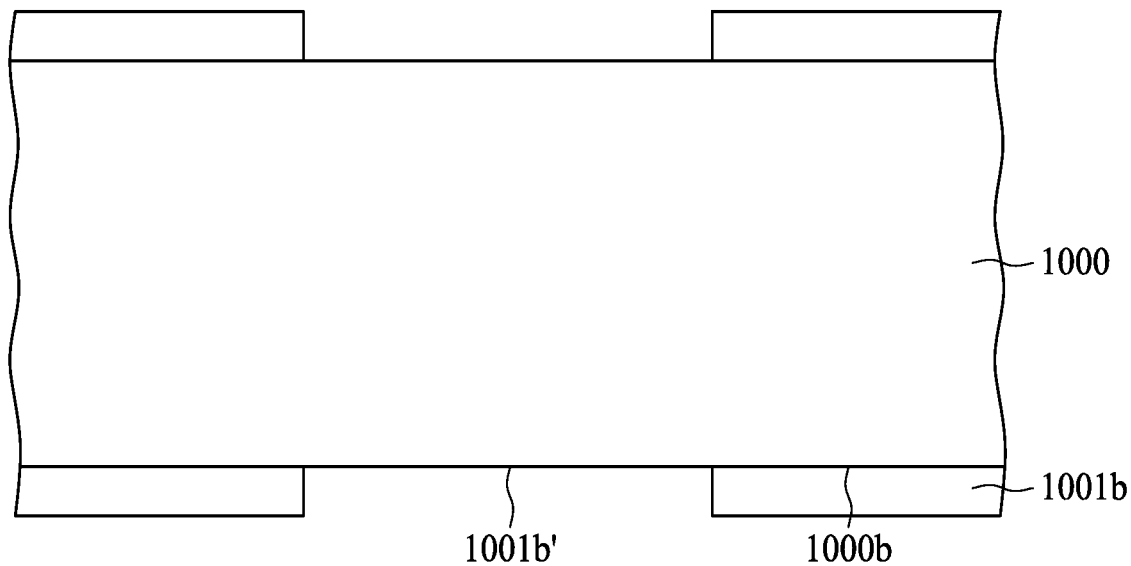

Referring to FIG. 10D, an opening 1001b' is formed on the passivation layer 1001b on the second cap surface 1000b of the cap layer 1000, which exposes the underlying cap layer 1000. In some embodiments, a photolithography process and an etching process are performed to remove a predetermined portion of the passivation layer 1001b' to form the opening 1001b'.

Figure 10E:
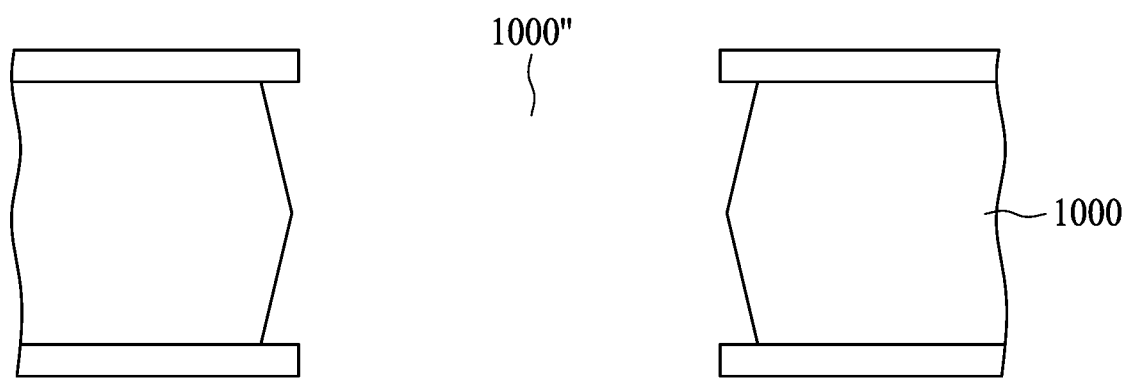
Figure 10F:
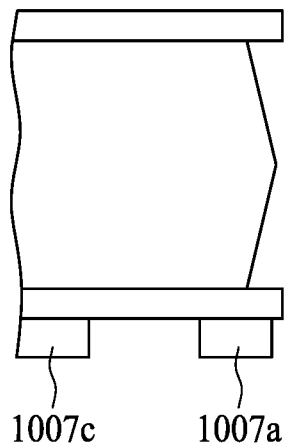
Figure 10F:
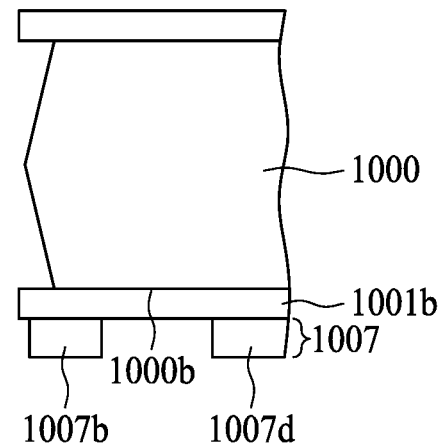
Figure 10G:
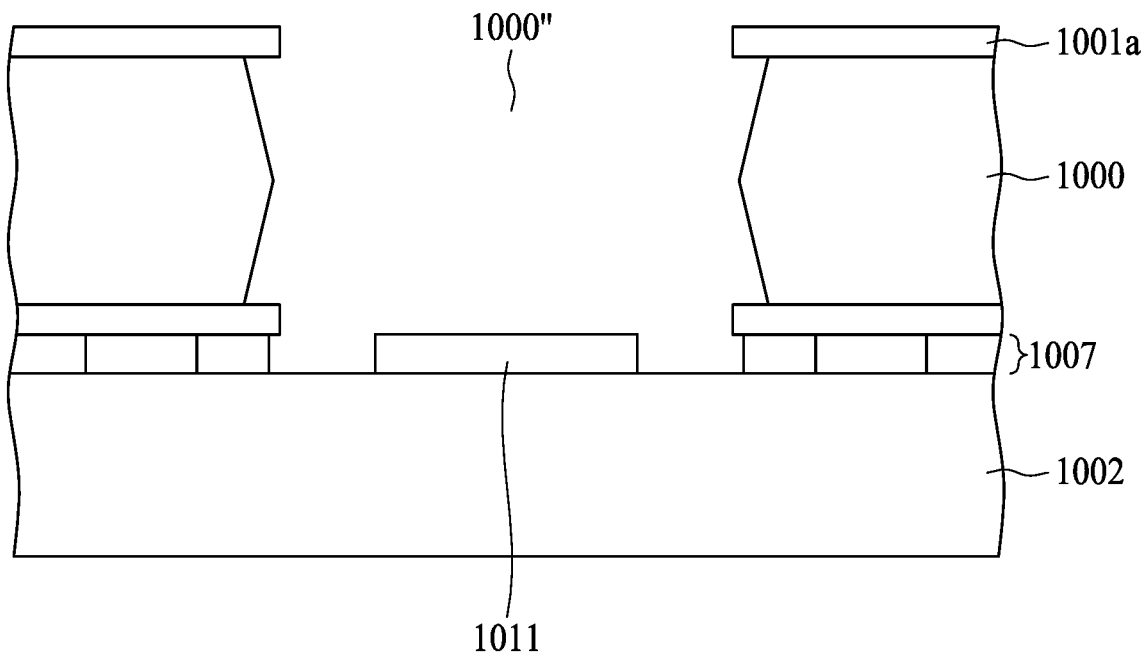

Referring to FIG. 10E, a through hole 1000" is formed in the cap layer 1000 by, for example, a wet etching technique. In some embodiments where the cap layer 1000 is composed of silicon, a KOH wet etching or a tetramethylammonium hydroxide (TMAH) wet etching technique can be utilized.

Referring to 10F, a bonding layer 1007 is formed adjacent to the second cap surface 1000b of the cap layer 1000 and patterned so that it may include a dam structure 1007a, 1007b and a bonding structure 1007c, 1007d. In some embodiments, the bonding layer 1007 is disposed on the passivation layer 1001b.

Referring to 10G, the cap layer 1000 is bonded to a semiconductor wafer 1002 through the bonding layer 1007. The semiconductor wafer 1002 includes a bonding pad 1011 disposed adjacent to the first wafer surface 1002a of the semiconductor wafer 1002. The through hole 1000" in the semiconductor wafer 1000 exposes the bonding pad 1011 on the semiconductor wafer 1002.

Figure 10H:
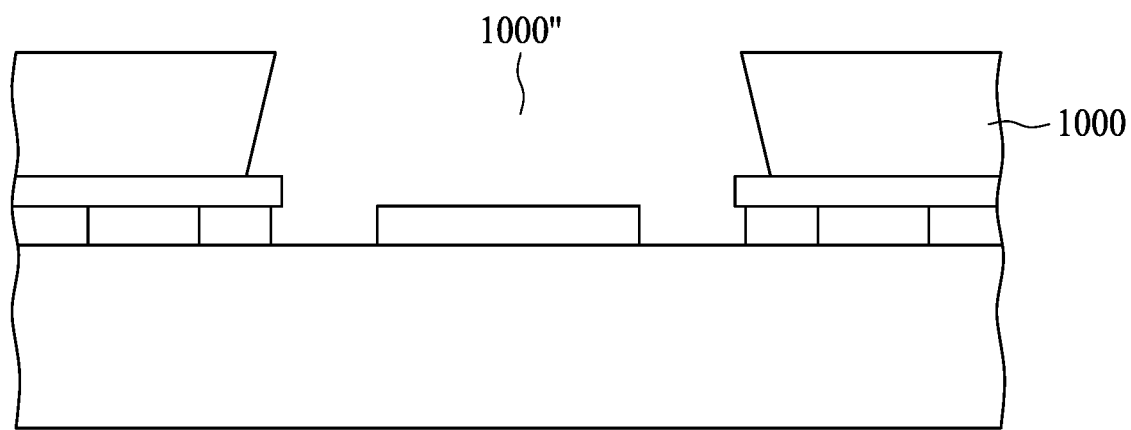

Referring to FIG. 10H, the cap layer 1000 is thinned down by, for example, a grinding process to a predetermined thickness and the passivation layer 1001a is removed.

Figure 10I:
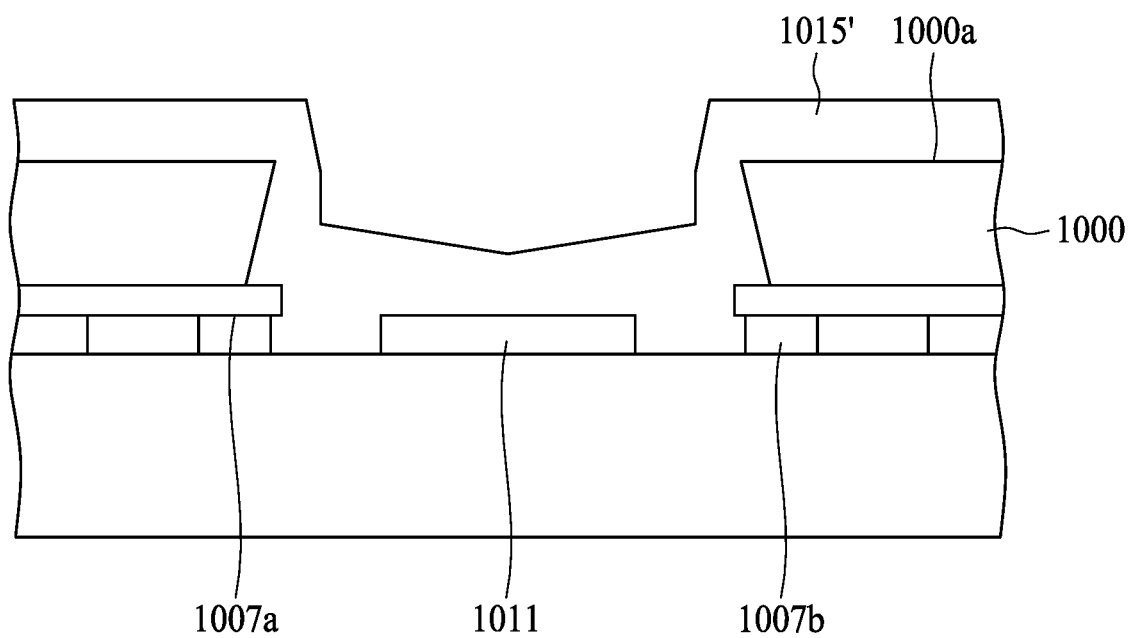

Referring to FIG. 10I, an isolation material 1015' is disposed in the through hole 1000" and over the first cap surface 1000a of the cap layer 1000. The isolation material 1015' may fill the space between the dam structure 1007a, 1007b and cover the bonding pad 1011. The isolation material 1015' may be disposed by a spin coating technique or a spay technique.

Figure 10J:
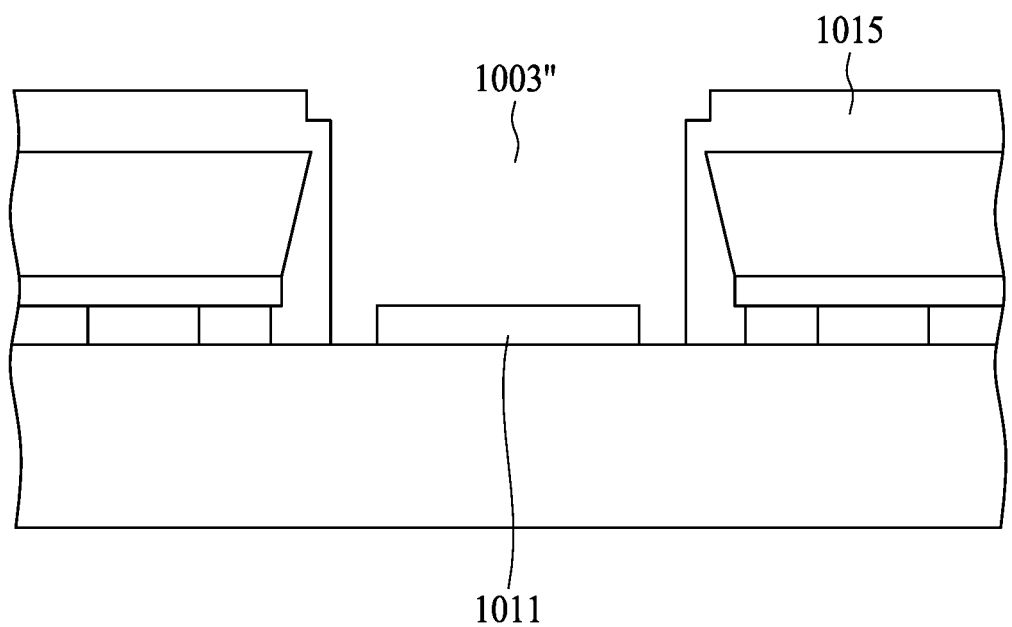

Referring to FIG. 10J, a portion of the isolation material 1015' is removed, thereby exposing a portion of a surface of the bonding pad 1011 and forming an isolation layer 1015 and a second through opening 1003". In some embodiments, a horizontal portion of the isolation material 1015' is removed. In some embodiments, the removal of the portion of the isolation material 1015' is performed by a combination of a photolithography and an etching technique.

Figure 10K:
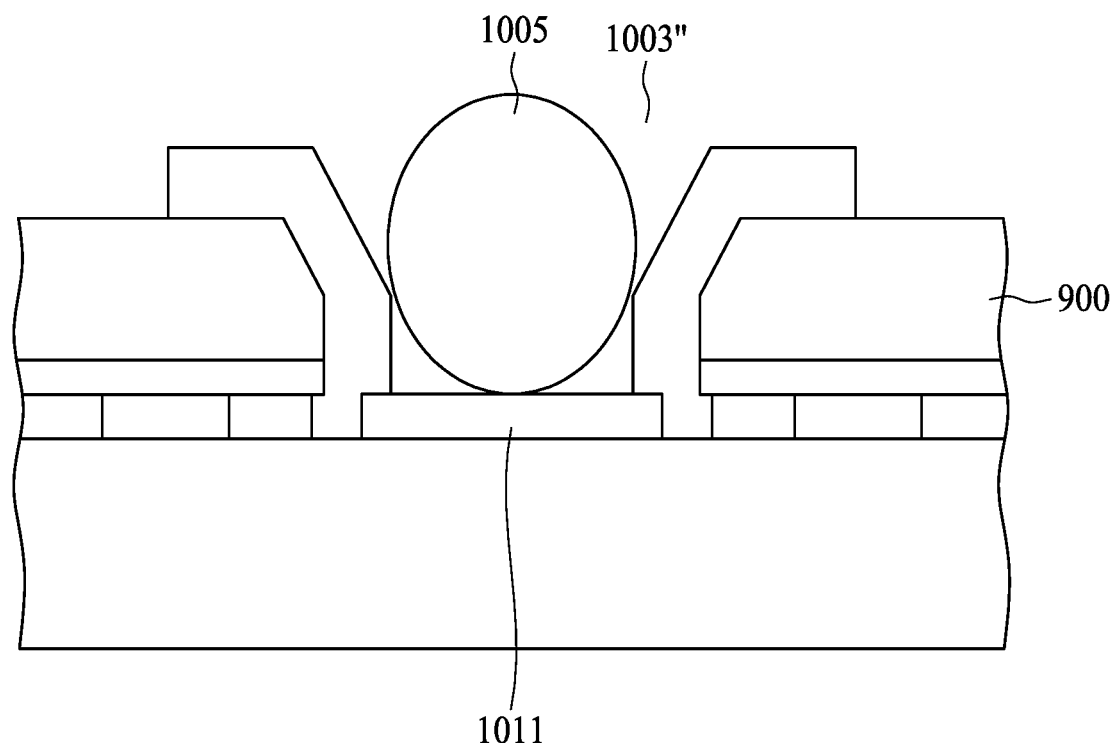

Referring to FIG. 10K, a conductive terminal 1005 is formed in the second through opening 1003" of the cap layer 900. In some embodiments, the conductive terminal 1005 is a solder ball or a solder layer, which can be formed by a solder ball placement technique or a solder paste printing technique. Subsequently, a solder ball may be formed by a reflowing process, which electrically connects to the bonding pad 1011.

FIG. 11A, FIG. 12A, FIG. 13A, FIG. 14A, and FIG. 15A illustrate a method for manufacturing a semiconductor package such as the semiconductor package 500 of FIG. 5A. FIG. 11A, FIG. 12A, FIG. 13A, FIG. 14A, FIG. 15A, and FIG. 16A illustrate a method for manufacturing a semiconductor package according to an embodiment of the present disclosure. FIG. 11B, FIG. 12B, FIG. 13B, FIG. 14B, FIG. 15B, and FIG. 16B illustrate a corresponding perspective view of FIG. 11A, FIG. 12A, FIG. 13A, FIG. 14A, FIG. 15A, and FIG. 16A, respectively.

Figure 11A:
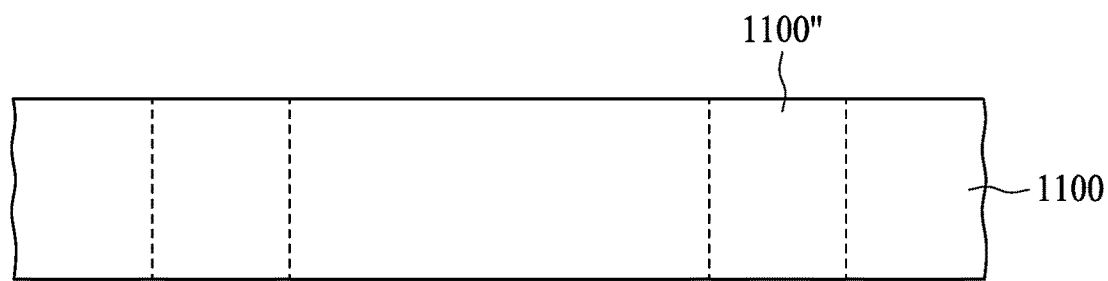
FIG. 11A, FIG. 12A, FIG. 13A, FIG. 14A, and FIG. 15A illustrate a method for manufacturing a semiconductor package such as the semiconductor package of FIG. 5A.
Figure 11B:
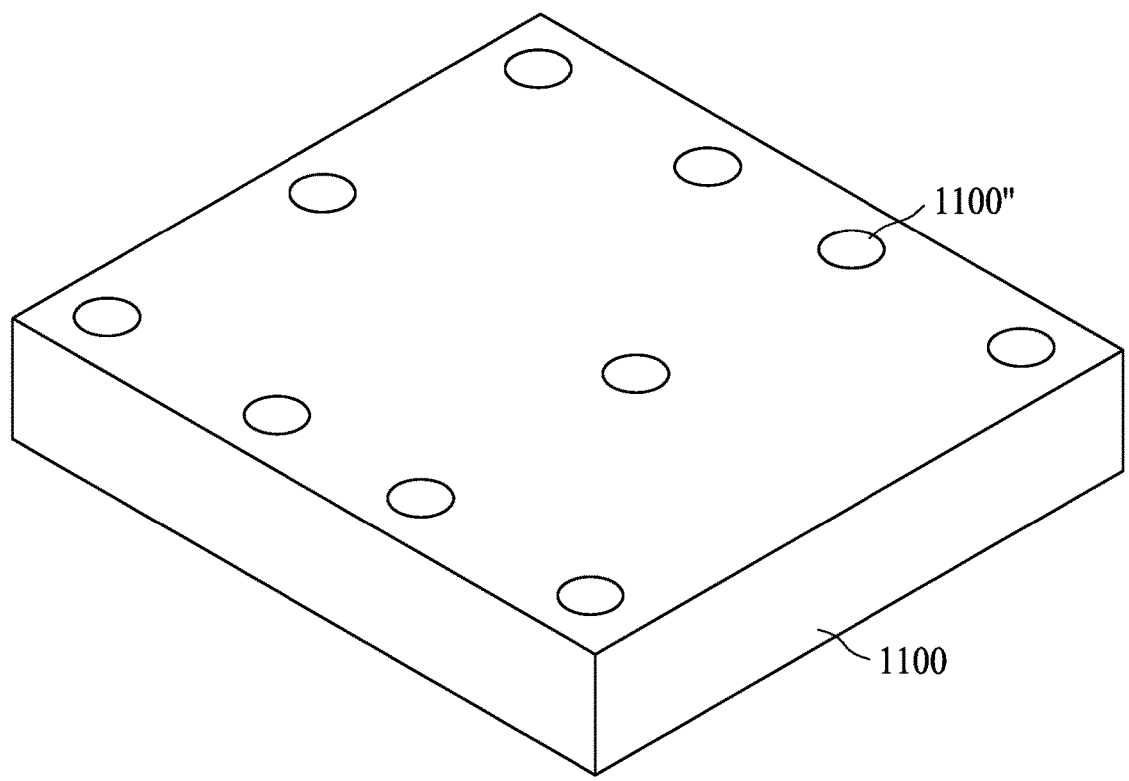
FIG. 11B, FIG. 12B, FIG. 13B, FIG. 14B, FIG. 15B, and FIG. 16B illustrate a corresponding perspective view of FIG. 11A, FIG. 12A, FIG. 13A, FIG. 14A, FIG. 15A, and FIG. 16A, respectively.

Referring to FIG. 11A and FIG. 11B, a cap layer 1100 is provided with a plurality of through openings 1100". The cap layer 1100 may be a semiconductor wafer. Compared to a chip-to-wafer embodiment, the wafer-to-wafer approach can be adopted when the rigidity of the cap wafer is considered inappropriate to perform an on-tape dicing operation. In other words, if the rigidity of the cap wafer is sufficient to perform the on-tape dicing operation, the chip-to-wafer approach can be adopted. The semiconductor wafer 1100 can be composed of silicon, high resistive silicon (undoped silicon), or other III-V compound materials. The through openings 1100" may be formed by, for example, a laser drilling technique. Note the laser drilling process can be performed on both silicon wafers and glass wafers without additional wet etch or dry etch. In some embodiments, a width of the through openings 1100" is in a range of from about 100 μm to about 200 μm.

Figure 12A:
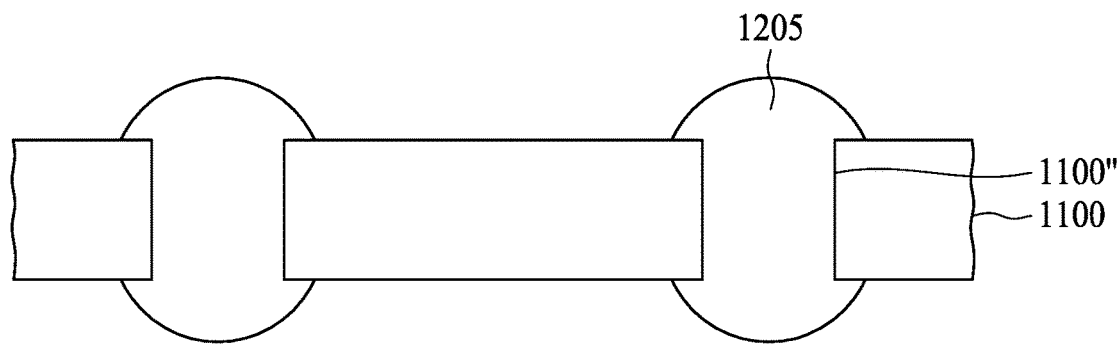
Figure 12B:
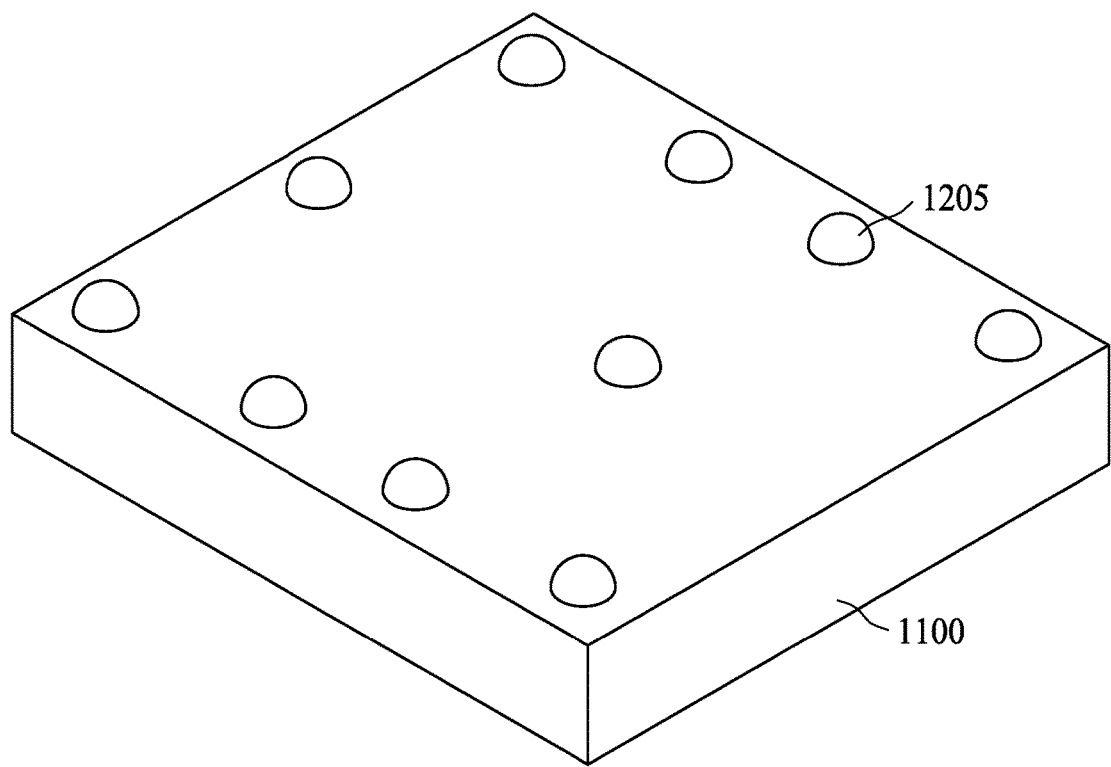

Referring to FIG. 12A and FIG. 12B, a conductive terminal 1205 is formed in the through openings 1100" of the cap layer 1100. In some embodiments, the conductive terminal 1205 is a solder via, which can be formed by, for example, printing a solder paste followed by a reflow process. The solder via is configured to bond the cap layer 1100 or the subsequent singulated cap layer to another wafer.

Figure 13A:
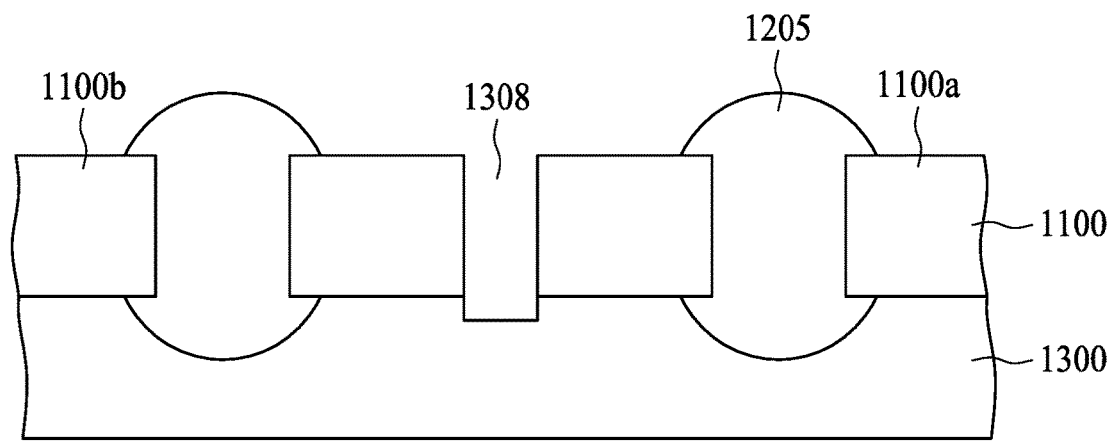
Figure 13B:
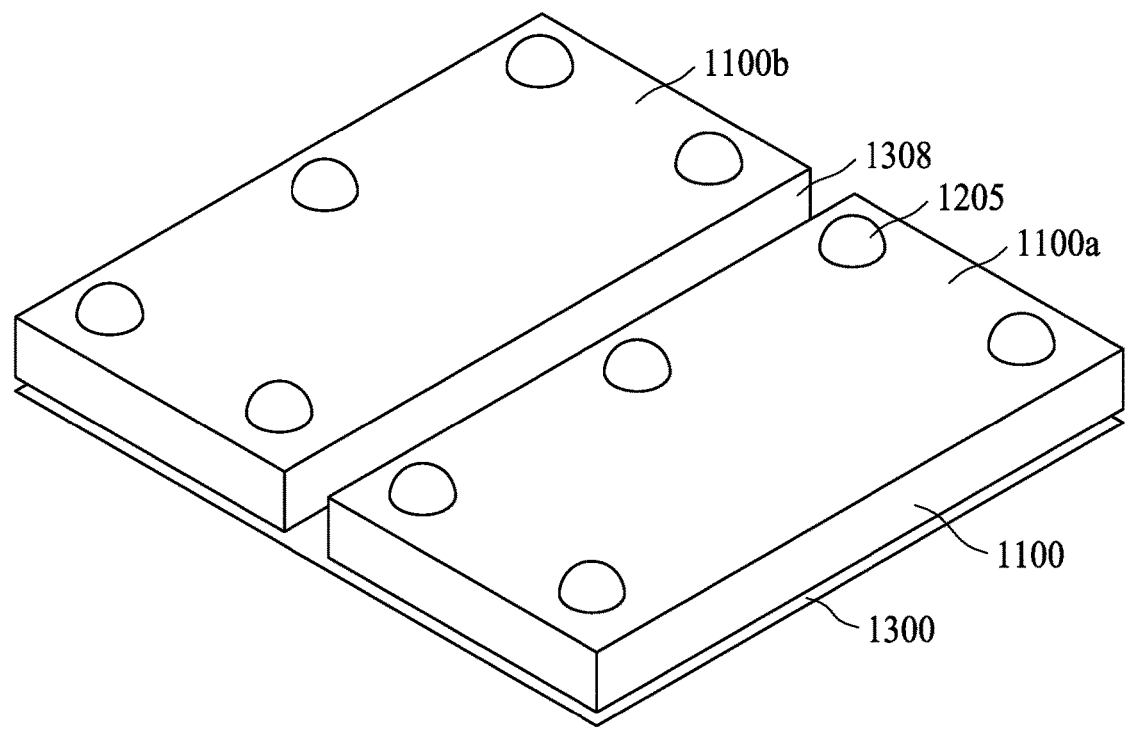

Referring to FIG. 13A and FIG. 13B, the cap layer 1100 with the solder via 1205 is mounted to a tape 1300, which is configured to support the cap layer 1100 during a dicing operation. As shown in FIG. 13A and FIG. 13B, a dicing operation is performed to separate the cap layer 1100 into at least two individual cap layers 1100a, 1100b. The saw trench 1308 is between the adjacent individual cap layers 1100a, 1100b hold by the tape 1300.

Figure 14A:
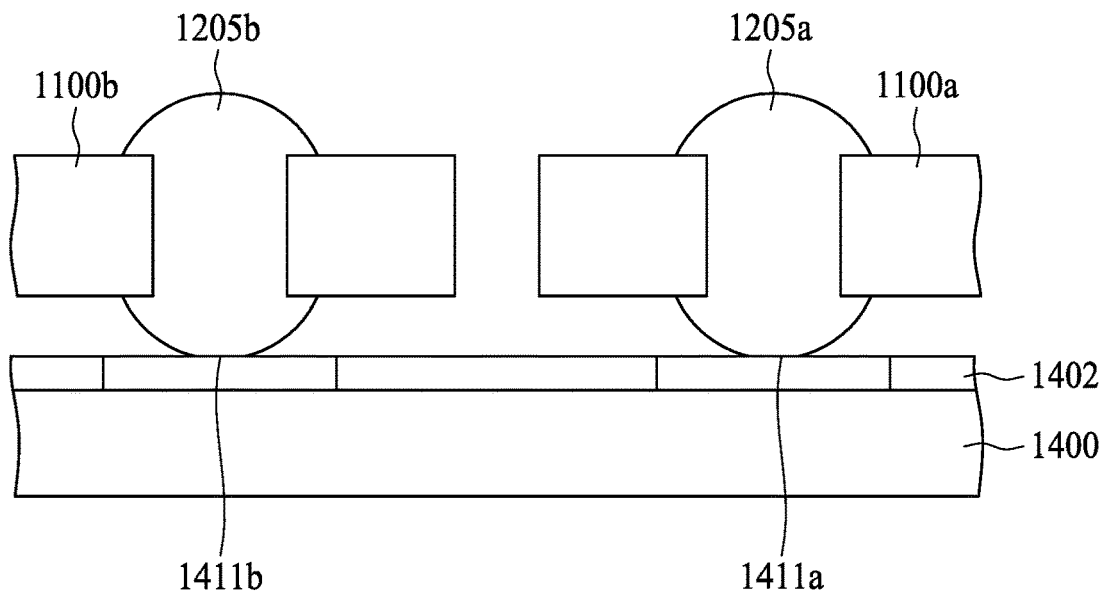
Figure 14B:
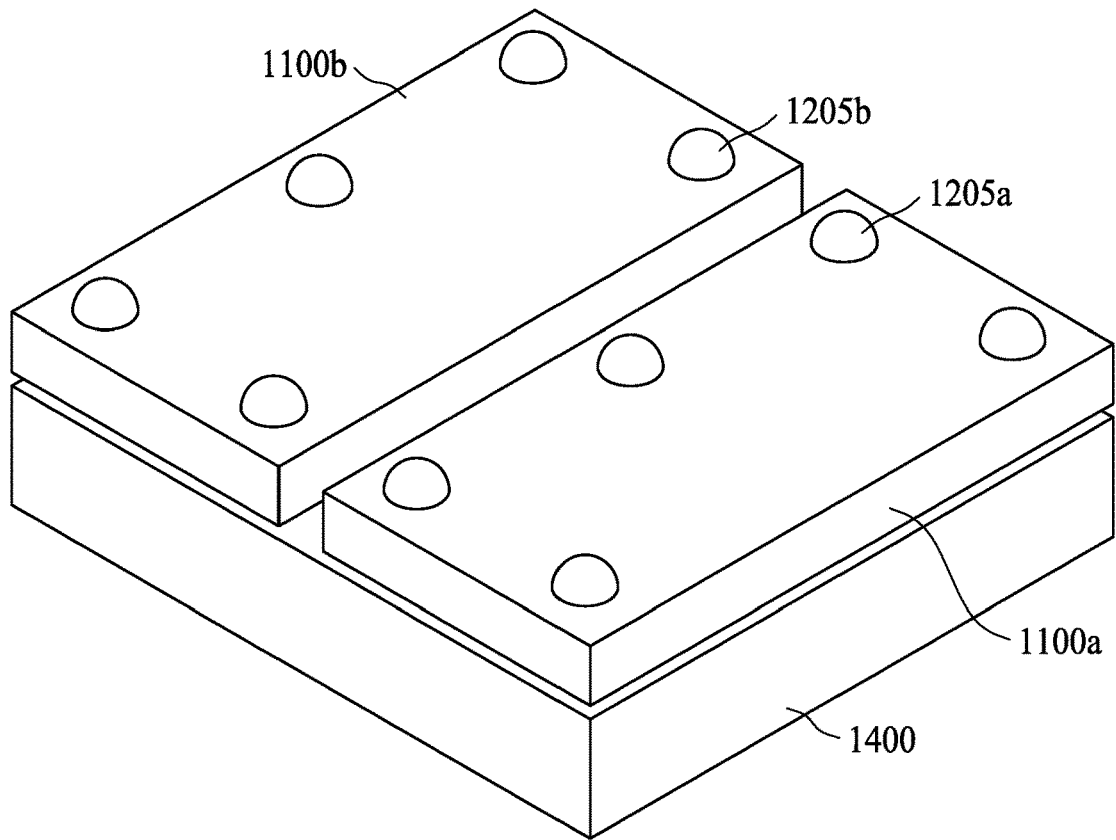

Referring to FIG. 14A and FIG. 14B, each of the individual cap layers 1100a, 1100b is picked and placed onto a semiconductor wafer 1400 by a chip-to-wafer bonding operation. The conductive terminal 1205a, 1205b on the cap layer 1100a, 1100b is aligned with the corresponding bonding pad 1411a, 1411b on the semiconductor wafer 1400 and bonded by a reflow operation. A protective layer 1402 may be disposed surrounding the conductive pad 1411a, 1411b.

Figure 15A:
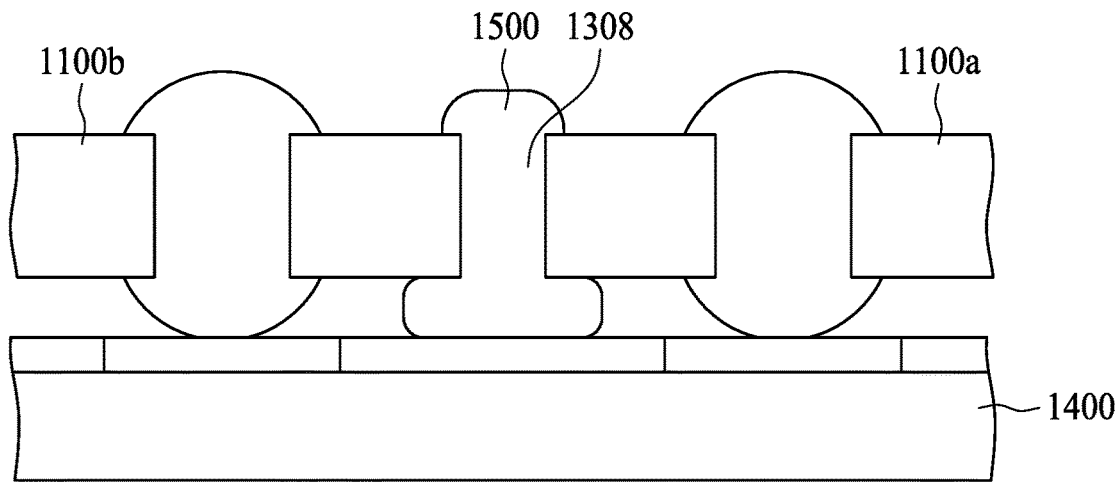
Figure 15B:
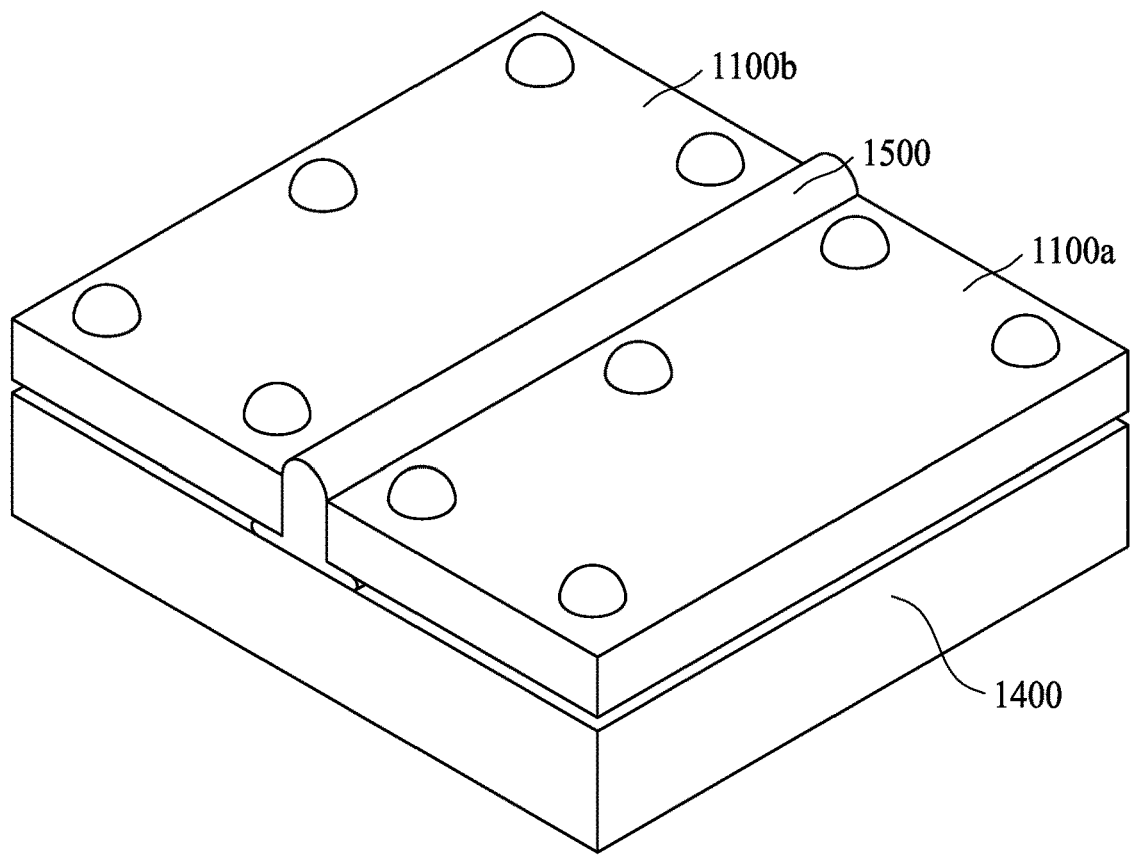

Referring to FIG. 15A and FIG. 15B, a bonding structure 1500 is disposed in the saw trench 1308 between adjacent cap layers 1100a, 1100b. Subsequently, a semiconductor package, such as the one illustrated in FIG. 5A, may be obtained. In some embodiments, the bonding structure 1500 is disposed by dispensing a sealing gel over the saw trench 1308 between adjacent cap layers 1100a, 1100b, filling the saw trench 1308 and overfilling to the surface of the cap layer 1100a, 1100b. In some embodiments, the bonding structure 1500 binds the individual cap layer 1100a, 1100b and the semiconductor wafer 1400 together. The bonding structure 1500 may protrude from a top of the diced cap layer 1100a, 1100b. The bonding structure 1500 is applied to prevent the contaminants from entering a space between the sawed cap layer 1100 and sawed semiconductor wafer 1400 in the subsequent singulation operation.

Figure 16A:
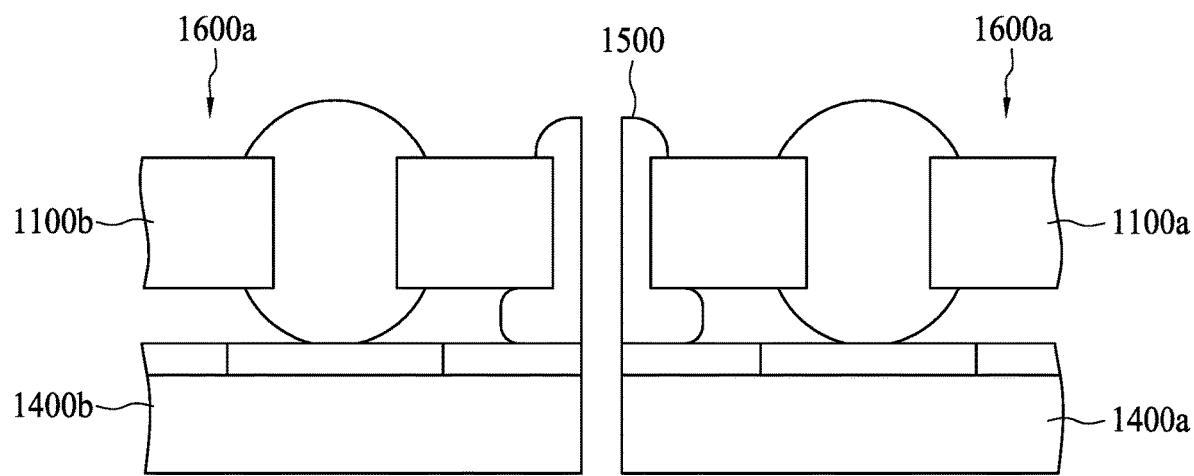
Figure 16B:
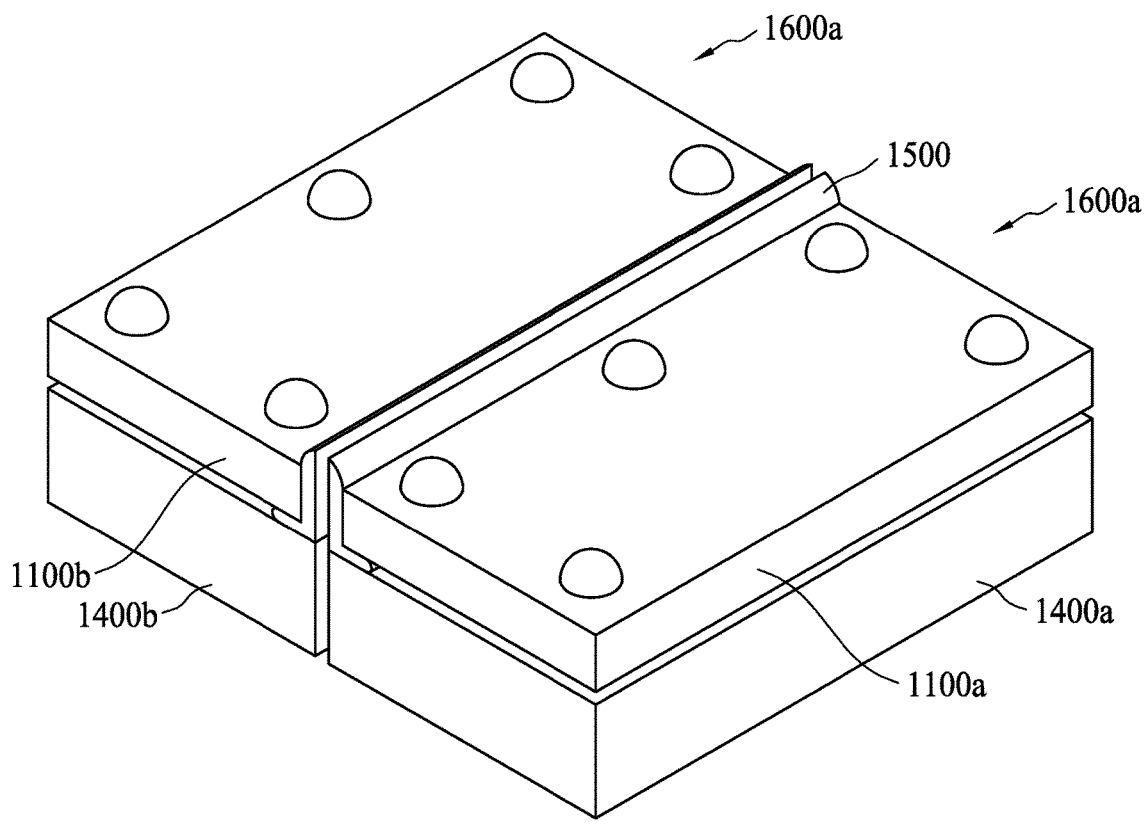

Referring to FIG. 16A and FIG. 16B, a singulation or dicing process is performed on the bonding structure 1500 of the semiconductor package to separate the semiconductor package into individual semiconductor packages 1600a, 1600b. In some embodiments, the singulation or dicing process is performed by, for example, a sewing process. Each of the semiconductor packages 1600a, 1600b includes a sawed semiconductor wafer 1400a, 1400b and an individual cap layer 1100a, 1100b. The bonding structure 1500 can be optionally removed after the dicing or singulation process.

FIGS. 17A-17I illustrate a method for manufacturing a semiconductor package such as the semiconductor package 600 of FIG. 6.

Figure 17A:
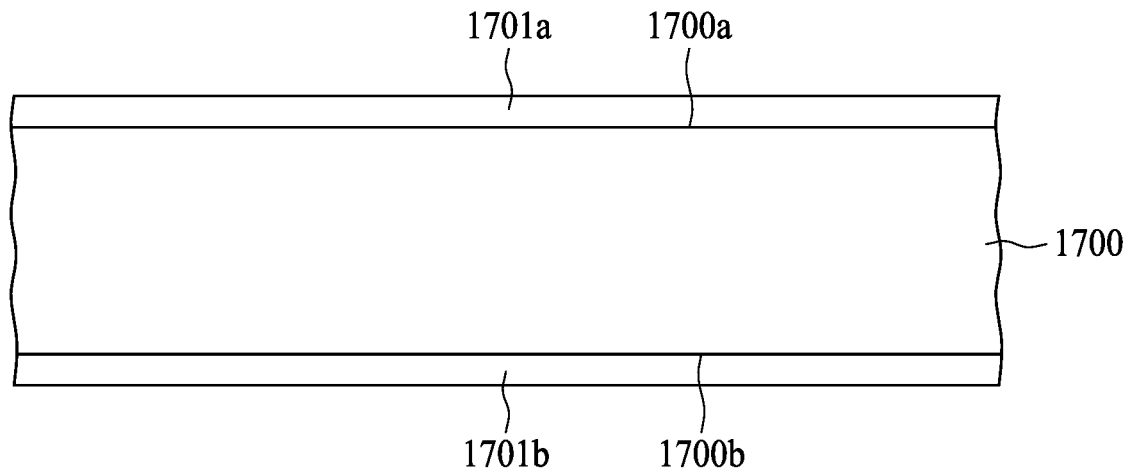
FIG. 17A, FIG. 17B, FIG. 17C, FIG. 17D, FIG. 17E, FIG. 17F, FIG. 17G, FIG. 17H, and FIG. 17I illustrate a method for manufacturing a semiconductor package such as the semiconductor package of FIG. 6.

Referring to FIG. 17A, a cap layer 1700 is provided. The cap layer 1700 has a first cap surface 1700a and a second cap surface 1700b opposite to the first cap surface 1700a. The cap layer 1700 may be a semiconductor wafer. The semiconductor wafer 1700 can be composed of silicon, high resistive silicon (undoped silicon), or other III-V compound materials. A passivation layer 1701a, 1701b is formed over the first cap surface 1700a and the second cap surface 1700b of the cap layer 1700, respectively. In some embodiments, the passivation layer 1701a, 1701b is formed by a thermal oxidation operation, a nitride low-pressure chemical vapor deposition operation, or the combination thereof.

Figure 17B:
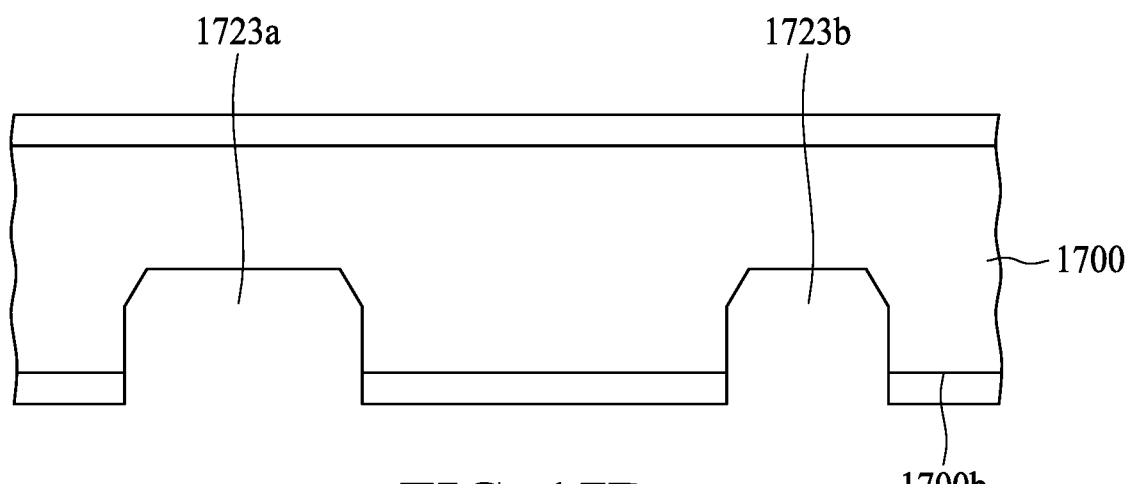

Referring to FIG. 17B, a cavity 1723a, 1723b is formed at the second cap surface 1700b of the cap layer 1700 for the active region of the respective semiconductor die. The cavity 1723a, 1723b may be formed by, for example, a laser drilling technique.

Figure 17C:
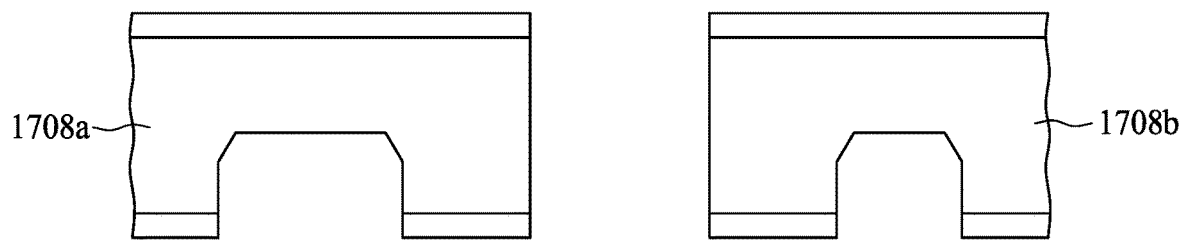

Referring to FIG. 17C, a singulation or dicing process is performed to separate the cap layer 1700 into individual cap layer 1708a, 1708b.

Figure 17D:
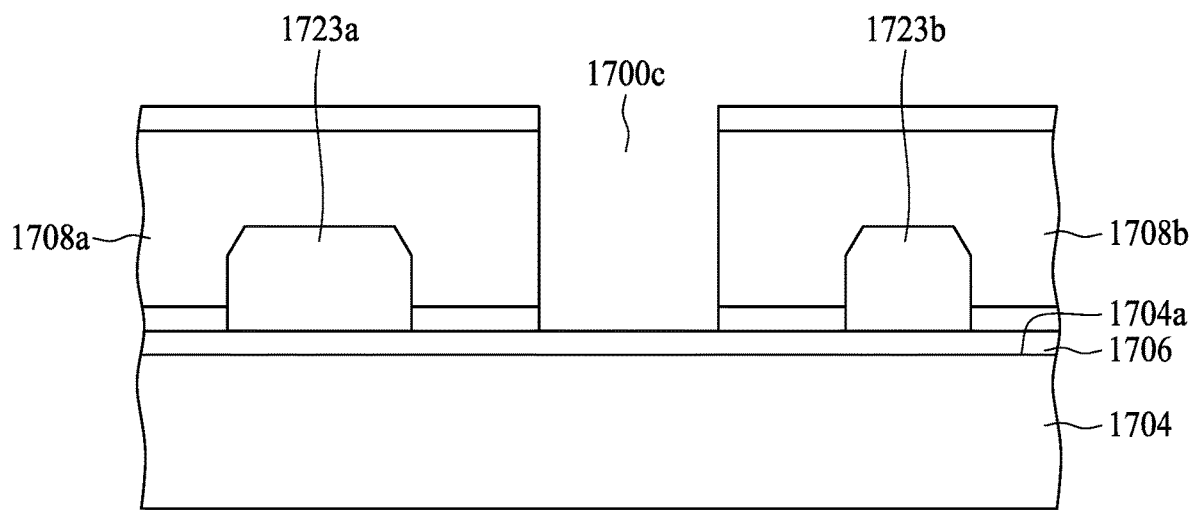

Referring to FIG. 17D, each of the individual cap layers 1708a, 1708b is picked and placed onto a carrier 1704 by a chip-to-wafer bonding operation. The carrier 1704 includes a metal seed layer 1706 disposed adjacent to a surface 1704a of the carrier 1704. The metal seed layer 1706 is exposed by the cavity 1723a, 1723b of the respective cap layer 1708a, 1708b and by the opening 1700c defined by the adjacent cap layers 1708a, 1708b.

Figure 17E:
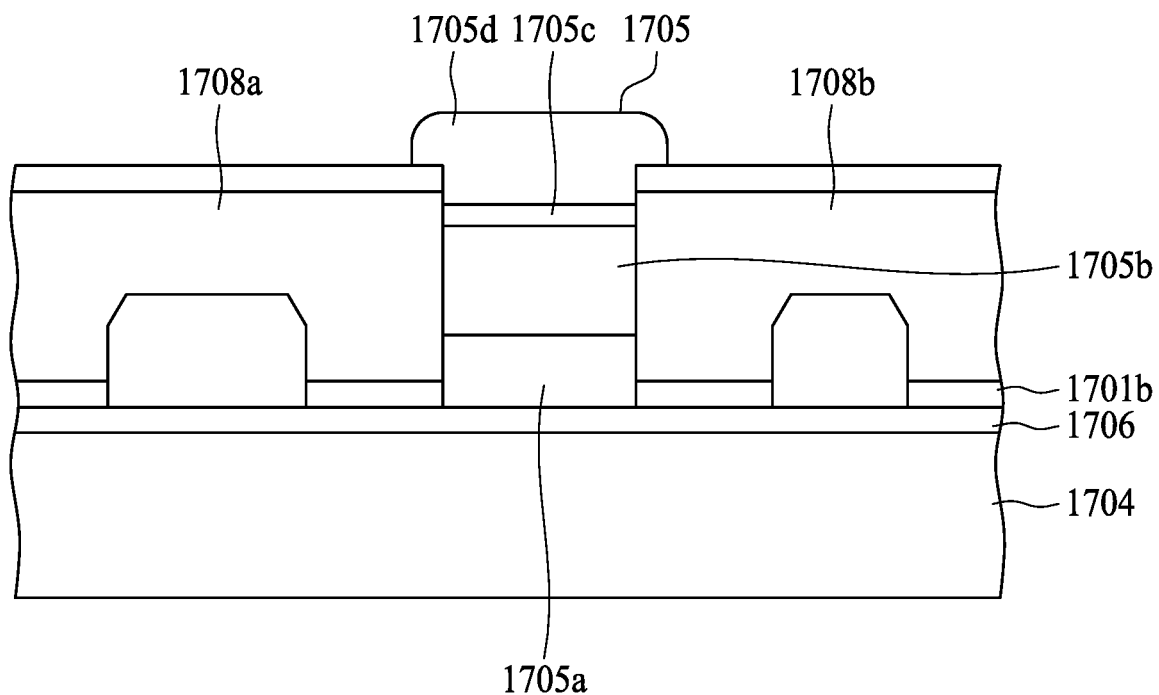

Referring to FIG. 17E, a conductive terminal 1705 may be formed from the exposed portion of the metal seed layer 1706 defined by the opening 1700c defined by the adjacent cap layers 1708a, 1708b. In some embodiments, the conductive terminal 1705 is a pillar structure, which may include an under bump metallization (UBM) layer 1705a, a pillar 1705b, a barrier layer 1705c, and a solder layer 1705d. In some embodiments, the conductive terminal 1705 is formed by, for example, a combination of a physical vapor deposition, plating, photolithography, etching, solder reflowing, or other suitable processes.

Figure 17F:
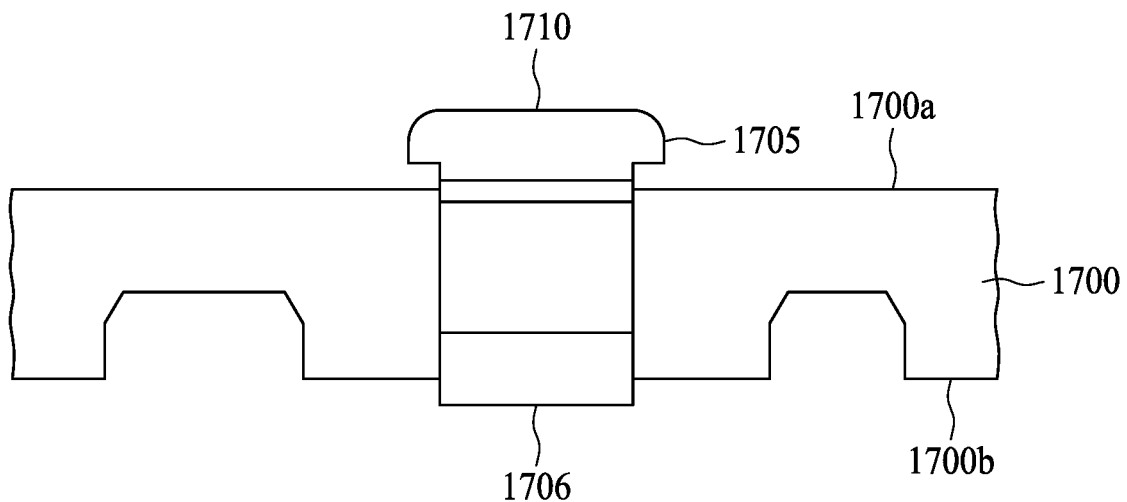

Referring to FIG. 17F, the carrier 1704, the passivation layer 1701b, and the metal seed layer 1706 shown in FIG. 17E are removed. In some embodiments, the top surface 1710 of the conductive terminal 1705 protrudes from the first cap surface 1700a of the cap layer 1700 and the bottom surface 1706 of the conductive terminal 1705 protrudes from the second cap surface 1700b of the cap layer 1700.

Figure 17G:
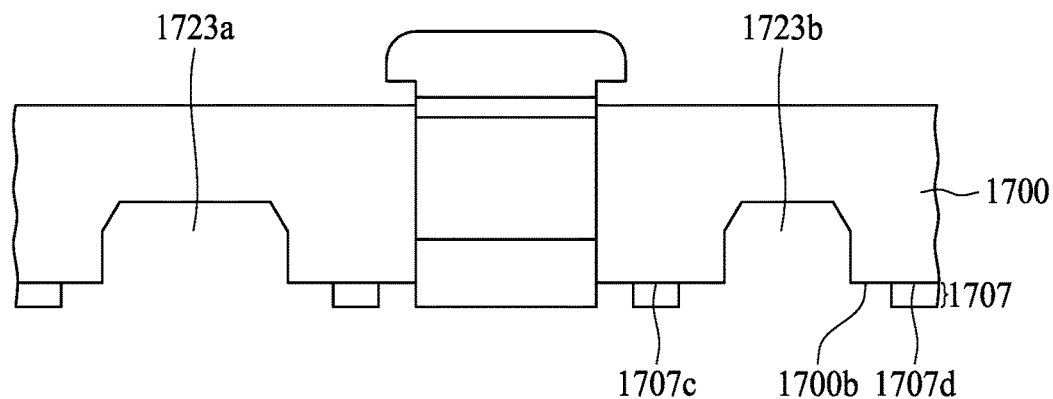

Referring to FIG. 17G, a bonding layer 1707 is formed adjacent to the second cap surface 1700b of the cap layer 1700. In some embodiments, the bonding layer 1707 includes a dam structure 1707c, 1707d. The dam structure 1707c, 1707d is closer to the cavity 1723b. In some embodiments, the bonding layer 1707 can be composed of photoresist materials (e.g., SU-8), polymeric materials (e.g., benzocyclobutene (BCB)), epoxies, or the like. In some embodiments, the bonding layer 1707 can be composed of metallic materials such as eutectic alloys including, but not limited to, Au—In, Cu—Sn, Au—Sn, Au—Ge, Au—Si, Al—Ge, Al—Si, and is deposited, sputtered, or plated on the second cap surface 1700b of the cap layer 1700.

Figure 17H:
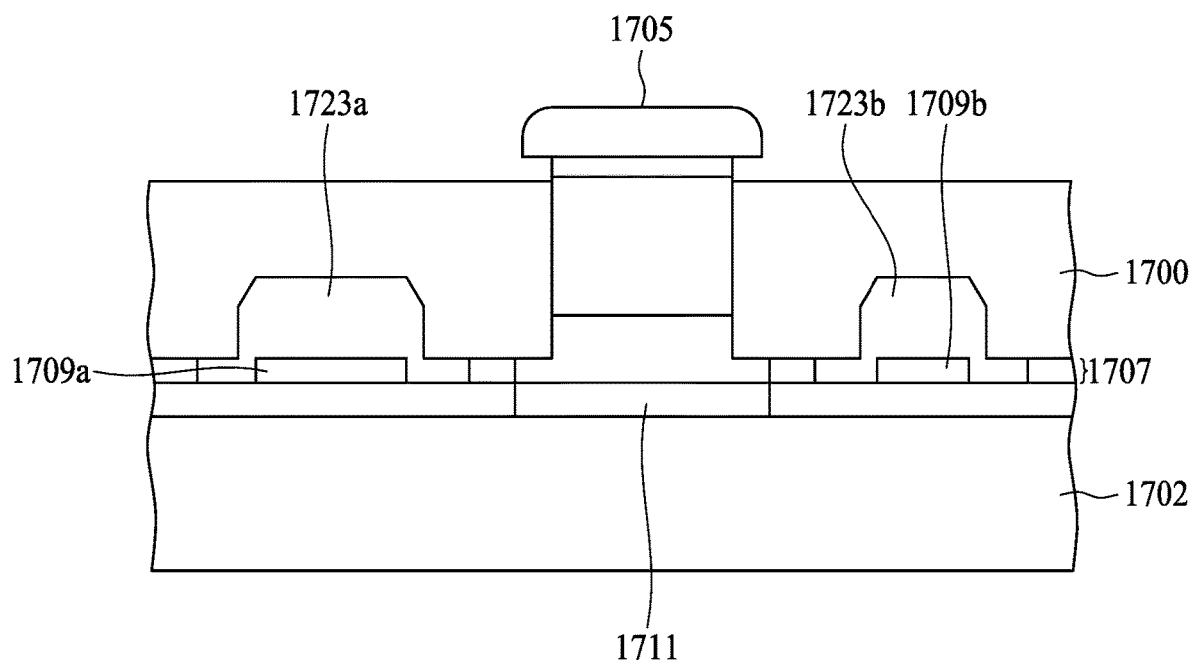

Referring to FIG. 17H, the cap layer 1700 is bonded to a semiconductor wafer 1702 via the bonding layer 1707, where the cavity 1723a, 1723b corresponds to respective active region of the respective semiconductor die of the semiconductor wafer 1702 and the conductive terminal 1705 electrically connects to the respective bonding pad 1711 of the semiconductor wafer 1702. The semiconductor wafer 1702 may include at least one active region 1709a, 1709b corresponding to a respective semiconductor die, including, for example, a communication chip, a microprocessor chip, a graphics chip, or a MEMS chip.

Figure 17I:
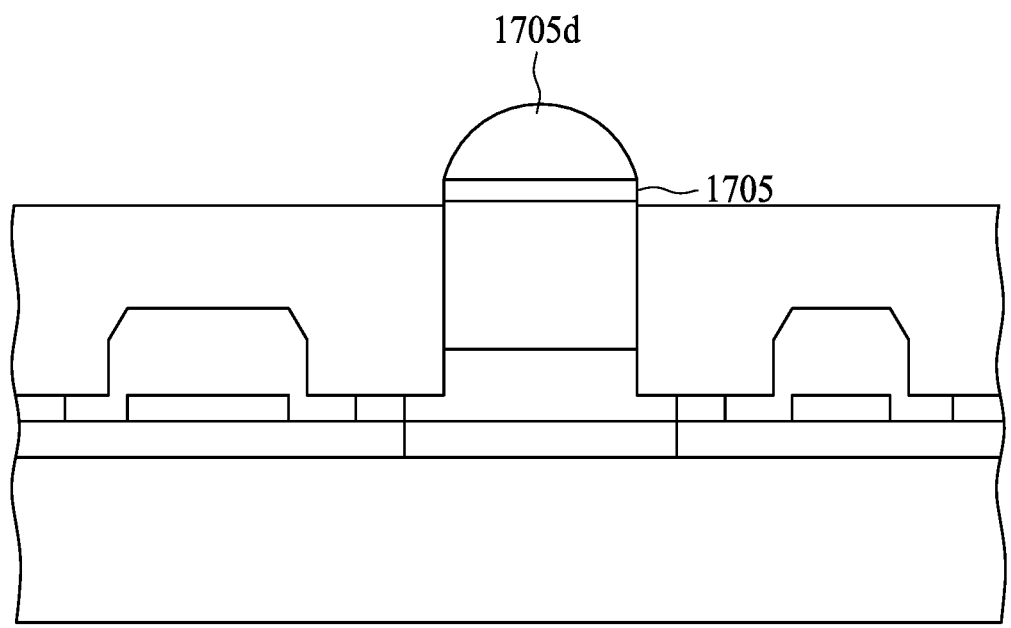

Referring to FIG. 17I, in some embodiments where the conductive terminal 1705 is a pillar structure including a solder layer 1705d, a solder ball may be formed by a reflowing process. Subsequently, a semiconductor package, such as the one illustrated in FIG. 6, may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 μm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
a semiconductor die having a first surface;
a cap layer over the semiconductor die, having a second surface facing the first surface;
a conductive terminal penetrating the cap layer and electrically connected to the semiconductor die; and
a dam structure between the semiconductor die and the cap layer, surrounding a portion of the conductive terminal between the first surface and the second surface, thereby forming a gap between the cap layer and the semiconductor die, wherein the conductive terminal is in contact with a bonding pad of the semiconductor die, and the dam structure is disposed between the bonding pad and an active region of the semiconductor die.

2. The semiconductor package of claim 1, further comprising a bonding structure between the semiconductor die and the cap layer.

3. The semiconductor package of claim 2, wherein the bonding structure is spaced from the dam structure.

4. The semiconductor package of claim 2, wherein the cap layer, the bonding structure, and the semiconductor die form a cavity accommodating the active region of the semiconductor die.

5. The semiconductor package of claim 2, wherein the bonding structure does not contact the conductive terminal.

6. The semiconductor package of claim 2, wherein the bonding structure does not contact the dam structure.

7. The semiconductor package of claim 1, further comprising an isolation layer lining a sidewall of the through opening of the cap layer.

8. The semiconductor package of claim 7, further comprising a conductive layer lining over the isolation layer.

9. The semiconductor package of claim 1, further comprising a passivation layer between the cap layer and the dam structure.

10. The semiconductor package of claim 1, wherein the dam structure is spaced from the conductive terminal.

11. The semiconductor package of claim 1, wherein the conductive terminal comprises an under bump metallization (UBM) layer, a pillar, a barrier layer, and a solder layer, wherein the UBM layer comprises a solder material and the pillar comprises copper.

12. The semiconductor package of claim 1, wherein the dam structure is immediately surrounding the conductive terminal.

13. The semiconductor package of claim 1, wherein the dam structure surrounds more than one side of the bonding pad.

14. The semiconductor package of claim 1, wherein the cap layer further comprises a top surface opposite to the second surface of the cap layer and a side surface between the top surface and the second surface, wherein the side surface of the cap layer has a first portion and a second portion and wherein the first portion is inclined to the top surface and the second portion is vertical to the second surface.

15. A method for manufacturing a semiconductor package, comprising:
  patterning a cap wafer to form a through opening connecting a first surface and a second surface of the cap wafer;
  patterning a bonding layer at the second surface of the cap wafer;
  bonding the cap wafer to a semiconductor wafer; and
  dicing the cap wafer and the semiconductor wafer;
  wherein patterning the cap wafer to form the through opening comprises:
    conducting a first etch from the first surface prior to bonding the cap wafer to the semiconductor wafer; and
    conducting a second etch to form the through opening after bonding the cap wafer to the semiconductor wafer.

16. The method of claim 15, wherein patterning the bonding layer comprises:
  forming a dam structure surrounding the through opening from the second surface; and
  forming a bonding structure at the second surface.

17. The method of claim 16, further comprising forming an isolation layer lining a sidewall of the through opening of the cap wafer.

18. The method of claim 17, further comprising forming a conductive layer lining over the isolation layer.

19. The method of claim 15, further comprising disposing solder materials in the through opening of the cap wafer after bonding the cap wafer to the semiconductor wafer.

20. The method of claim 15, wherein patterning the cap wafer to form a through opening comprises forming a passivation layer over the first surface and the second surface.

21. The method of claim 15, further comprising forming a conductive terminal in the through opening prior to patterning the bonding layer at the second surface.

* * * * *